(12) United States Patent
Roh et al.

(10) Patent No.: US 12,219,875 B2
(45) Date of Patent: Feb. 4, 2025

(54) POWER-GENERATING APPARATUS

(71) Applicant: LG INNOTEK CO., LTD., Seoul (KR)

(72) Inventors: Myoung Lae Roh, Seoul (KR); Seung Yong Lee, Seoul (KR); Hyung Eui Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 95 days.

(21) Appl. No.: 17/755,820

(22) PCT Filed: Nov. 2, 2020

(86) PCT No.: PCT/KR2020/015160
§ 371 (c)(1),
(2) Date: May 9, 2022

(87) PCT Pub. No.: WO2021/091184
PCT Pub. Date: May 14, 2021

(65) Prior Publication Data
US 2022/0384701 A1    Dec. 1, 2022

(30) Foreign Application Priority Data

Nov. 8, 2019   (KR) .................. 10-2019-0142907
Dec. 3, 2019   (KR) .................. 10-2019-0159250

(51) Int. Cl.
*H10N 10/13*     (2023.01)
*H10N 10/17*     (2023.01)
*H10N 10/80*     (2023.01)

(52) U.S. Cl.
CPC ............. *H10N 10/13* (2023.02); *H10N 10/17* (2023.02); *H10N 10/80* (2023.02)

(58) Field of Classification Search
None
See application file for complete search history.

(56) References Cited

U.S. PATENT DOCUMENTS

2007/0045044 A1*  3/2007  Sullivan ................. F01N 1/084
                                                    181/268
2016/0099398 A1   4/2016  Lorimer et al.
2017/0358727 A1*  12/2017 Gaiser .................... F01N 5/025

FOREIGN PATENT DOCUMENTS

| JP | H10201269 A | * | 7/1998 | ............ H02N 11/00 |
| JP | 2015-128351 A | | 7/2015 | |
| KR | 10-2017-0011156 A | | 2/2017 | |
| KR | 10-2018-0134070 A | | 12/2018 | |

(Continued)

OTHER PUBLICATIONS

Machine translation of JPH10201269A (Year: 1998).*

(Continued)

*Primary Examiner* — Tamir Ayad
(74) *Attorney, Agent, or Firm* — SALIWANCHIK, LLOYD & EISENSCHENK

(57) ABSTRACT

A power-generating apparatus according to an embodiment of the present invention comprises: a housing in which a fluid flows along the interior thereof and at least a portion of the wall surface thereof includes a flat surface formed of metal; a thermoelectric module disposed on the flat surface of the housing; and an insulating member disposed on the flat surface of the housing so as to be beside the thermoelectric module.

4 Claims, 19 Drawing Sheets

(56) References Cited

FOREIGN PATENT DOCUMENTS

| | | |
|---|---|---|
| KR | 10-2019-0026455 A | 3/2019 |
| KR | 10-2019-0070002 A | 6/2019 |
| KR | 10-2019-0088703 A | 7/2019 |
| WO | 2017/022874 A1 | 2/2017 |

OTHER PUBLICATIONS

International Search Report dated Feb. 9, 2021 in International Application No. PCT/KR2020/015160.
Office Action dated Nov. 30, 2023 in Korean Application No. 10-2019-0159250.
Office Action dated Dec. 20, 2023 in Korean Application No. 10-2019-0142907.

* cited by examiner

------▶ : FLUID FLOW DIRECTION

⋯▶ : FLUID FLOW DIRECTION

1000 : 1100, 1200, 1300, 1400

POWER-GENERATING APPARATUS

CROSS-REFERENCE TO RELATED APPLICATIONS

This application is the U.S. national stage application of International Patent Application No. PCT/KR2020/015160, filed Nov. 2, 2020, which claims the benefit under 35 U.S.C. § 119 of Korean Application Nos. 10-2019-0142907, filed Nov. 8, 2019; and 10-2019-0159250, filed Dec. 3, 2019; the disclosures of each of which are incorporated herein by reference in their entirety.

TECHNICAL FIELD

This invention relates to a power-generating apparatus, and more particularly, to a power-generating apparatus for generating electricity from a high-temperature fluid using a thermoelectric element.

BACKGROUND ART

The thermoelectric phenomenon is one that occurs by the movement of electrons and holes in a material, and refers to direct energy conversion between heat and electricity.

The term "thermoelectric element" is a generic term for a device using a thermoelectric phenomenon, and has a structure in which a P-type thermoelectric material and an N-type thermoelectric material are bonded between metal electrodes to form a PN junction pair.

Thermoelectric devices may be classified into devices using a temperature change of electrical resistance, devices using the Seebeck effect (the phenomenon that electromotive force is generated by a temperature difference), devices using the Peltier effect (the phenomenon that heat absorption or heat generation occurs by an electric current), and the like.

Thermoelectric elements have been widely employed to home appliances, electronic parts, communication parts, and the like. For example, the thermoelectric element may be employed to an apparatus for cooling, an apparatus for heating, an apparatus for generating power, or the like. Accordingly, the demand for the thermoelectric performance of the thermoelectric element is becoming greater.

Recently, there is a need to generate electricity using a high-temperature fluid and a thermoelectric element. For example, a sensing device for detecting a flow rate, temperature, leakage, or the like of the fluid may be disposed adjacent to a pipe through which a high-temperature fluid flows, and electricity is required for the operation of such sensing device. Separate electrical wiring work is required to supply electricity to the sensing device, and if a pipe through which a high-temperature fluid flows is installed in a place where human access is not easy, such as being buried underground, electrical wiring work and maintenance may be challenging.

Accordingly, there have been attempts to generate electricity using heat from a high-temperature fluid by itself, and then to use it in neighboring sensing devices.

DISCLOSURE

Technical Problem

This invention is to provide a power-generating apparatus for generating electricity from a high-temperature fluid using a thermoelectric element.

Technical Solution

A power-generating apparatus according to an embodiment of this invention includes a housing through which a fluid flows, the housing including a flat surface with at least a portion of a wall surface made of metal; a thermoelectric module disposed on the flat surface of the housing; and a thermal insulating member disposed on a side surface of the thermoelectric module on the flat surface of the housing.

The thermoelectric module and the thermal insulating member may be disposed to directly contact the flat surface of the housing, respectively.

The fluid may flow into the housing through an inlet pipe, and the fluid may be discharged to the outside of the housing through an outlet pipe, and the housing may include a plurality of branch pipes through which the fluid having flowed along the inlet pipe branches and passes, and the plurality of branch pipes may be combined in the outlet pipe.

A first region constituting one branch pipe of the plurality of branch pipes may be disposed to form a predetermined angle with a second region constituting another branch pipe of the plurality of branch pipes.

The thermoelectric module may be disposed on at least one of outer surfaces of the first region and the second region.

The thermoelectric module may include a thermoelectric element and a heat sink disposed on the thermoelectric element, and a first surface of the thermoelectric element may be in contact with the flat surface, and the heat sink may be disposed on a second surface of the thermoelectric element opposite to the first surface.

A cooling unit for cooling the heat sink, which is driven using a flow rate of the fluid flowing along at least one of the inlet pipe and the outlet pipe may be further included.

The housing may include a first housing through which a first fluid flows, and which includes a first flat surface with at least a portion of a wall surface made of metal; and a second housing through which a second fluid flows, and which includes a second flat surface with at least a portion of a wall surface made of metal, wherein the thermoelectric module and the thermal insulating member may be respectively disposed between the first surface and the second surface, and the temperature of the first fluid and the temperature of the second fluid may be different from each other.

The volume of the second housing may be greater than that of the first housing, and wherein an air layer may be formed between an inner wall of the second housing and the second fluid.

A fastening member which fastens the first housing, the thermoelectric module, and the second housing may be further included, wherein the fastening member may include a head part disposed on an outer surface of the first housing, and a connection part which extends from the head part and penetrates the first housing, the thermoelectric module and a portion of the second housing, and an end of the connection part may be disposed in the second housing.

A power-generating apparatus according to another embodiment of this invention includes a first pipe through which a fluid flows at a predetermined flow rate; a second pipe connected to the first pipe, and allowing the fluid having flowed along the first pipe to branch into a plurality of paths and to pass through; a third pipe connected to the second pipe, and allowing the fluids having flowed along the plurality of paths to be collected; and a plurality of thermoelectric modules disposed on the surface of the second pipe, wherein at least a portion of the surface of the second pipe includes a flat surface made of metal, and the plurality of thermoelectric modules are disposed on the flat surface.

Each of the plurality of thermoelectric modules may include a thermoelectric element and a heat sink disposed on the thermoelectric element, and a first surface of the thermoelectric element may be in contact with the flat surface, and the heat sink may be disposed on a second surface of the thermoelectric element opposite to the first surface.

A cooling unit for cooling the heat sink, which is driven using the flow rate of the fluid flowing along the first pipe may be further included.

The cooling unit may include a first fan disposed in the first pipe, and rotated by the fluid flowing along the first pipe; a first rotation shaft connected to the first fan and extending out of the first pipe, and rotated together with the first fan; gears connected to the first rotation shaft; a second rotation shaft connected to the gear and rotated in a different direction from the first rotation shaft according to the rotation of the first rotation shaft; and a second fan connected to the second rotation shaft and rotated together with the second rotation shaft, wherein the second fan may be disposed over the heat sink.

The second pipe may include a first region, a second region and a third region, the second region and the third region may be disposed on both sides of the first region to form a predetermined angle, and a first branch pipe, a second branch pipe, and a third branch pipe may be formed in the first region, the second region, and the third region, respectively.

The plurality of thermoelectric modules may be disposed on at least one of outer surfaces of the first region, the second region, and the third region.

A distance between one surface of the first branch pipe and the outer surface of the first region may be constant.

A heat conversion system according to an embodiment of this invention includes a power-generating apparatus that generates power using the heat of a fluid; and a sensing device which operates using electricity generated from the power-generating apparatus, wherein the power-generating apparatus includes a first pipe through which a fluid flows at a predetermined flow rate; a second pipe connected to the first pipe, and allowing the fluid having flowed along the first pipe to branch into a plurality of paths and to pass through; a third pipe connected to the second pipe, and allowing the fluids having flowed along the plurality of paths to be collected; and a plurality of thermoelectric modules disposed on the surface of the second pipe, wherein at least a portion of the surface of the second pipe includes a flat surface made of metal, and the plurality of thermoelectric modules are disposed on the flat surface, and wherein the first pipe is a pipe branched from a fluid pipe through which a predetermined fluid flows, and the fluid collected in the third pipe flows into the fluid pipe.

A power-generating apparatus according to another embodiment of this invention includes a first housing receiving a first fluid; a second housing disposed to face the first housing and receiving a second fluid; a thermoelectric module disposed between the first housing and the second housing and including a first side and a second side; a first connection inlet pipe disposed on the first housing to introduce the first fluid to the first side of the thermoelectric module; and a first connection discharge pipe disposed on the first housing to discharge the first fluid received in the first housing; a second connection inlet pipe disposed on the second housing to introduce the second fluid to the second side of the thermoelectric module; and a second connection discharge pipe disposed on the second housing to discharge the second fluid received in the second housing, wherein the first side of the thermoelectric module is embedded in the first housing to be in direct contact with the first fluid, wherein the second side of the thermoelectric module is embedded in the second housing to be in direct contact with the second fluid, wherein a first thermal insulating member is disposed on a side surface of the thermoelectric module between the first housing and the second housing, wherein the temperature of the first fluid is lower than that of the second fluid, wherein the volume of the second housing is greater than that of the first housing, and wherein an air layer is formed between an inner wall of the second housing and the second fluid.

The air layer may be formed between an uppermost surface of an inner wall of the second housing and the second fluid.

A second heat insulating member covering the outer surface of the second housing may be further included.

A fastening member which fastens the first housing, the thermoelectric module, and the second housing may be further included, wherein the fastening member includes a head part disposed on an outer surface of the first housing, and a connection part which extends from the head part and penetrates the first housing, the thermoelectric module and a portion of the second housing, and an end of the connection part may be disposed in the second housing.

Heat dissipation fins each including a metal may be disposed on the inner wall of the first housing and the inner wall of the second housing.

The thermoelectric module may include a first heat dissipation fin, a first substrate disposed on the first heat dissipation fin, a first insulating layer disposed on the first substrate, a plurality of first electrodes disposed on the first insulating layer, a plurality of thermoelectric legs disposed on the plurality of first electrodes, a plurality of second electrodes disposed on the plurality of thermoelectric legs, a second insulating layer disposed on the plurality of second electrodes, a second substrate disposed on the second insulating layer, and a second heat dissipation fin disposed on the second substrate, wherein the first heat dissipation fin may be disposed in the first housing, and the second heat dissipation fin may be disposed in the second housing.

A cooling unit for cooling the outer surface of the first housing, which is driven by using the flow rate of the first fluid, may be further included.

A heat dissipation fin disposed on at least a portion of the outer surface of the first housing may be further included.

The end of the connection part may be disposed in the second fluid, and may be spaced apart from the air layer.

The direction of the first fluid introduced from the first connection inlet pipe and the direction of the second fluid introduced from the second connection inlet pipe may be different from each other.

The direction of the first fluid introduced from the first connection inlet pipe and the direction of the second fluid introduced from the second connection inlet pipe may be parallel to each other.

The direction of the first fluid introduced from the first connection inlet pipe and the direction of the second fluid introduced from the second connection inlet pipe may be opposite to each other.

At least one of the first connection inlet pipe, the first connection discharge pipe, the second connection inlet pipe, and the second connection discharge pipe may be adjustable in length.

A length of the second connection inlet pipe may be shorter than that of the first connection inlet pipe.

A power-generating system according to an embodiment of this invention includes a power-generating apparatus according to an embodiment of this invention and a battery unit for storing electricity generated from the power-generating apparatus.

Advantageous Effects

According to an embodiment of this invention, it is possible to obtain a power-generating apparatus which generates electricity by using the heat from a high-temperature fluid. According to an embodiment of this invention, it is possible to obtain a power-generating apparatus which can be easily installed and can increase power generation efficiency by maximizing the temperature difference ΔT. According to an embodiment of this invention, electricity can be generated by using a temperature difference between a supply pipe for supplying heat and a return pipe for the returning after supplying heat.

BEST MODE

Hereinafter, exemplary embodiments of the present invention will be described in detail with reference to the accompanying drawings.

However, the technical spirit of the present invention is not limited to some embodiments which will be described and may be realized using various other embodiments, and at least one component of the embodiments may be selectively coupled, substituted, and used to realize the technical spirit within the range of the technical spirit.

In addition, unless clearly and specifically defined otherwise by context, all terms (including technical and scientific terms) used herein can be interpreted as having customary meanings to those skilled in the art, and meanings of generally used terms, such as those defined in commonly used dictionaries, will be interpreted by considering contextual meanings of the related technology.

In addition, the terms used in the embodiments of the present invention are considered in a descriptive sense and not for limiting the present invention.

In the present specification, unless clearly indicated otherwise by the context, singular forms include the plural forms thereof, and in a case in which "at least one (or one or more) among A, B, and C" is described, this may include at least one combination among all possible combinations of A, B, and C.

In addition, in descriptions of components of the present invention, terms such as "first," "second," "A," "B," "(a)," and "(b)" can be used.

The terms are only to distinguish one element from another element, and an essence, order, and the like of the element are not limited by the terms.

In addition, it should be understood that, when an element is referred to as being "connected or coupled" to another element, such a description may include both of a case in which the element is directly connected or coupled to another element and a case in which the element is connected or coupled to another element with still another element disposed therebetween.

In addition, in a case in which any one element is described as being formed or disposed "on or under" another element, such a description includes both a case in which the two elements are formed or disposed in direct contact with each other and a case in which one or more other elements are interposed between the two elements. In addition, when one element is described as being disposed "on or under" another element, such a description may include a case in which the one element is disposed at an upper side or a lower side with respect to another element.

Figure 1A:
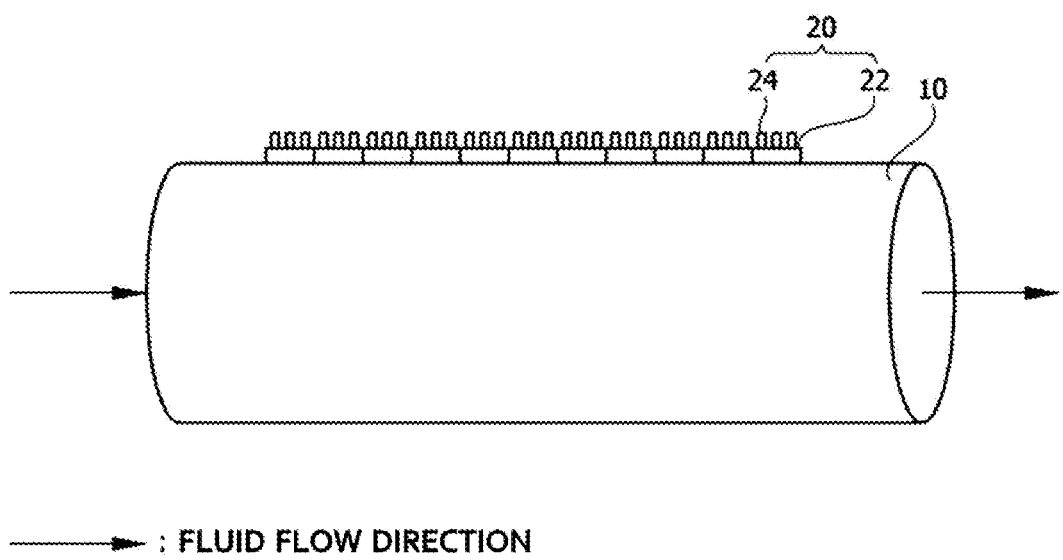
FIGS. 1a and 1b are an example of a power-generating apparatus.
Figure 1B:
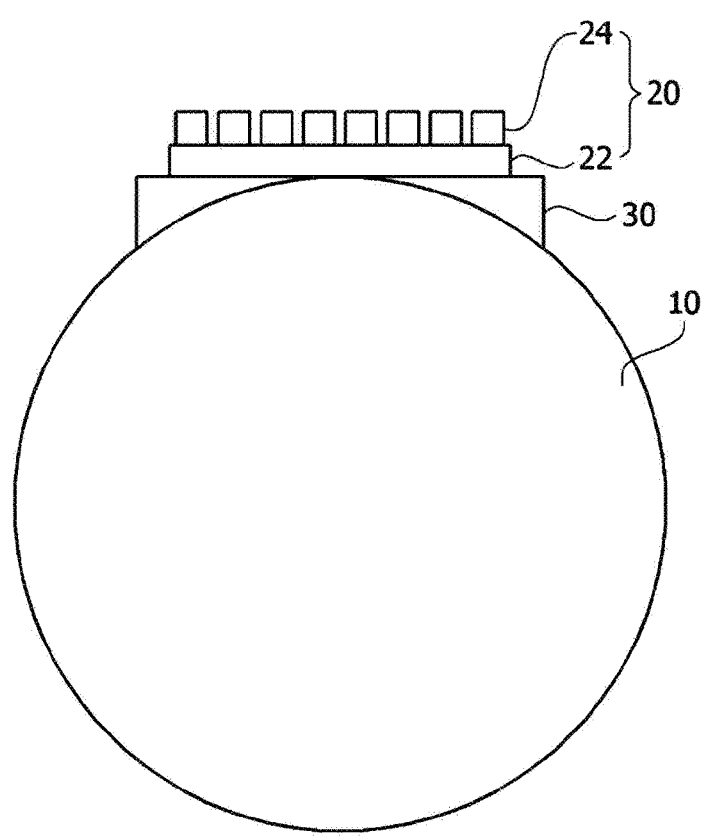
Figure 2A:
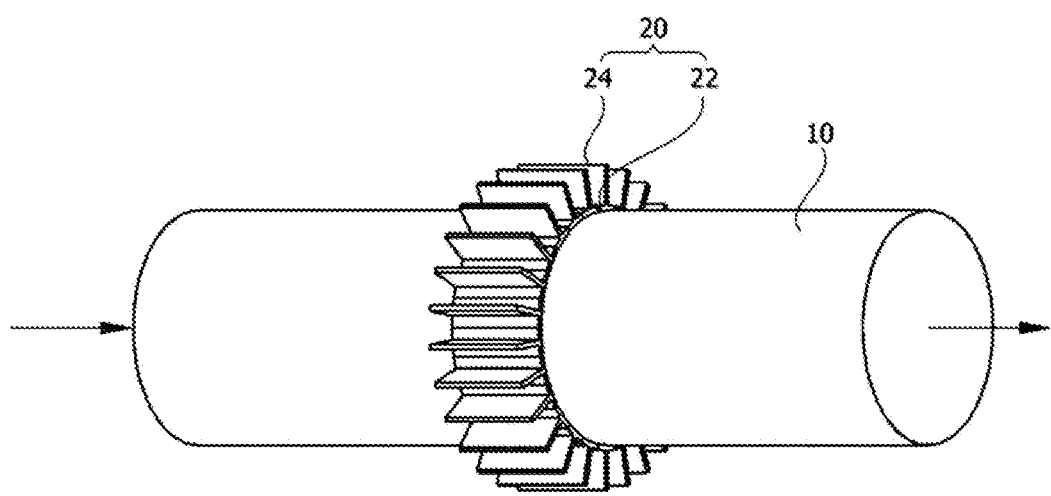
FIGS. 2a and 2b are another example of a power-generating apparatus.
Figure 2B:
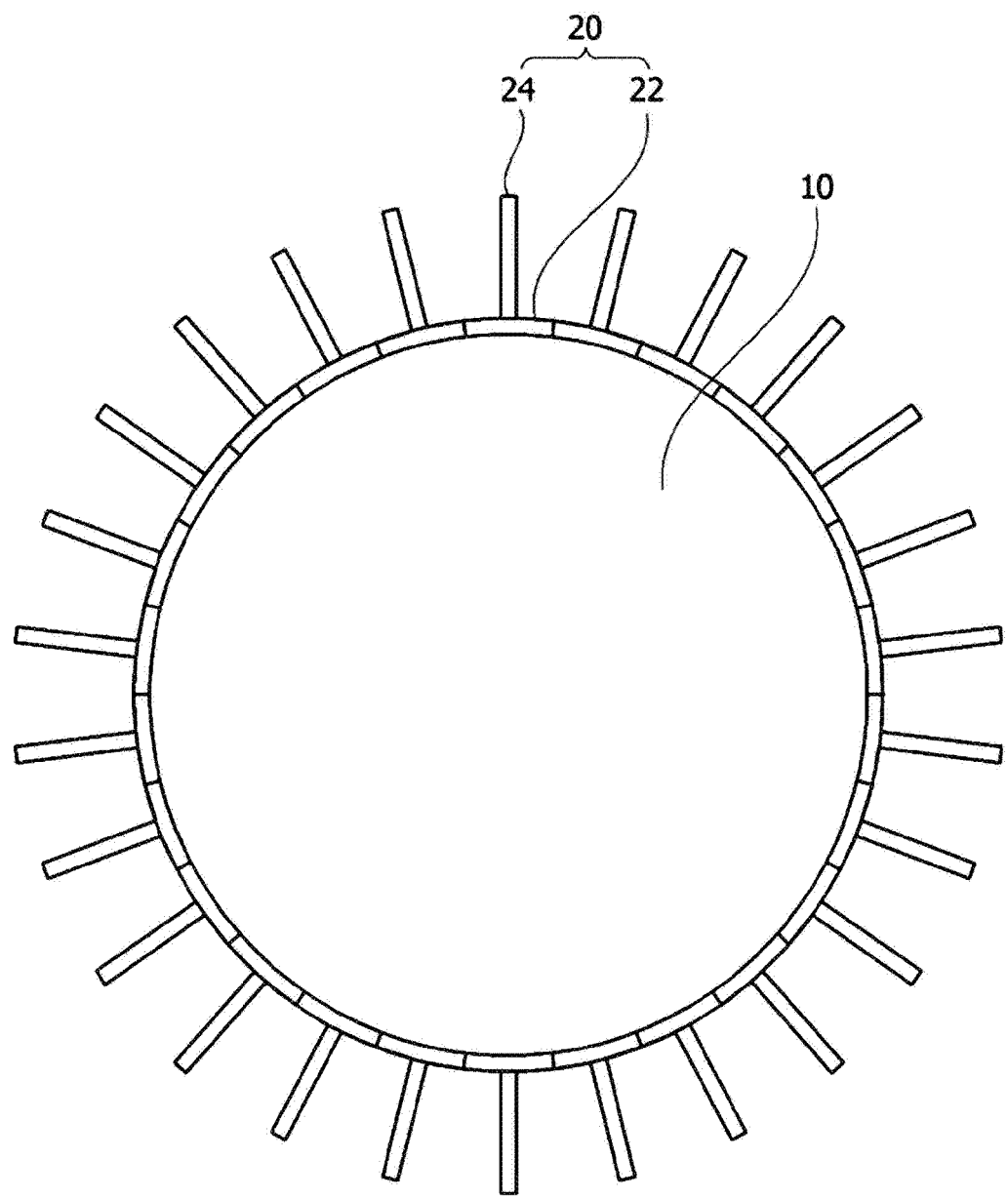

FIGS. 1a and 1b are an example of a power-generating apparatus, and FIGS. 2a and 2b are another example of the power-generating apparatus. FIGS. 1a and 2a are side views showing a plurality of thermoelectric modules disposed on the surface of a fluid pipe through which a fluid flows, and FIGS. 1b and 2b are cross-sectional views showing the plurality of thermoelectric modules disposed on the surface of the fluid pipe through which the fluid flows.

Referring to FIGS. 1a-2b, a plurality of thermoelectric modules 20 may be disposed on a surface of a fluid pipe 10 through which a fluid flows. In this case, the fluid may be a liquid or a gas, and the temperature of the fluid may be 50° C. or higher, preferably 70° C. or higher, and more preferably 90° C. or higher. Each of the plurality of thermoelectric modules 20 disposed on the surface of the fluid pipe 10 may include a thermoelectric element 22 disposed on the surface of the fluid pipe 10 and a heat sink 24 disposed on the thermoelectric element 22. Among both surfaces of the thermoelectric element 22, the surface closer to the surface of the fluid tube 10 is a high-temperature part, the surface closer to the heat sink 24 is a low-temperature part, and the plurality of thermoelectric modules 20 may generate power by using the temperature difference between the high-temperature part and the low-temperature part.

In this case, referring to FIGS. 1a and 1b, the plurality of thermoelectric modules 20 may be disposed on the surface of the fluid pipe 10 along the fluid flow direction.

Alternatively, referring to FIGS. 2a and 2b, the plurality of thermoelectric modules 20 may be disposed on the surface of the fluid pipe 10 along the cross-section of the fluid pipe 10.

Generally, since the surface of the fluid pipe 10 has a curved surface, and the thermoelectric element 22 has a flat surface, an additional structure such as a bracket 30 or the like is required in order to arrange the thermoelectric element 22 on the surface of the fluid pipe 10. Accordingly, since the heat on the surface of the fluid pipe 10 is not directly transferred to the thermoelectric element 22, it may be difficult to secure a predetermined temperature difference $\Delta T$ between the high-temperature part and the low-temperature part of the thermoelectric element 22. Also, in general, since the fluid pipe 10 needs to be thermally insulated from the outside, a thermal insulating material may be disposed on the surface of the fluid pipe. If the thermoelectric elements 22 are disposed on the surface of the fluid pipe 10, it may become difficult to construct the thermal insulating material.

According to an embodiment of this invention, a portion of the fluid flowing along the fluid pipe is bypassed, and the fluid in the bypassed path may be used as a heat source.

Figure 3:
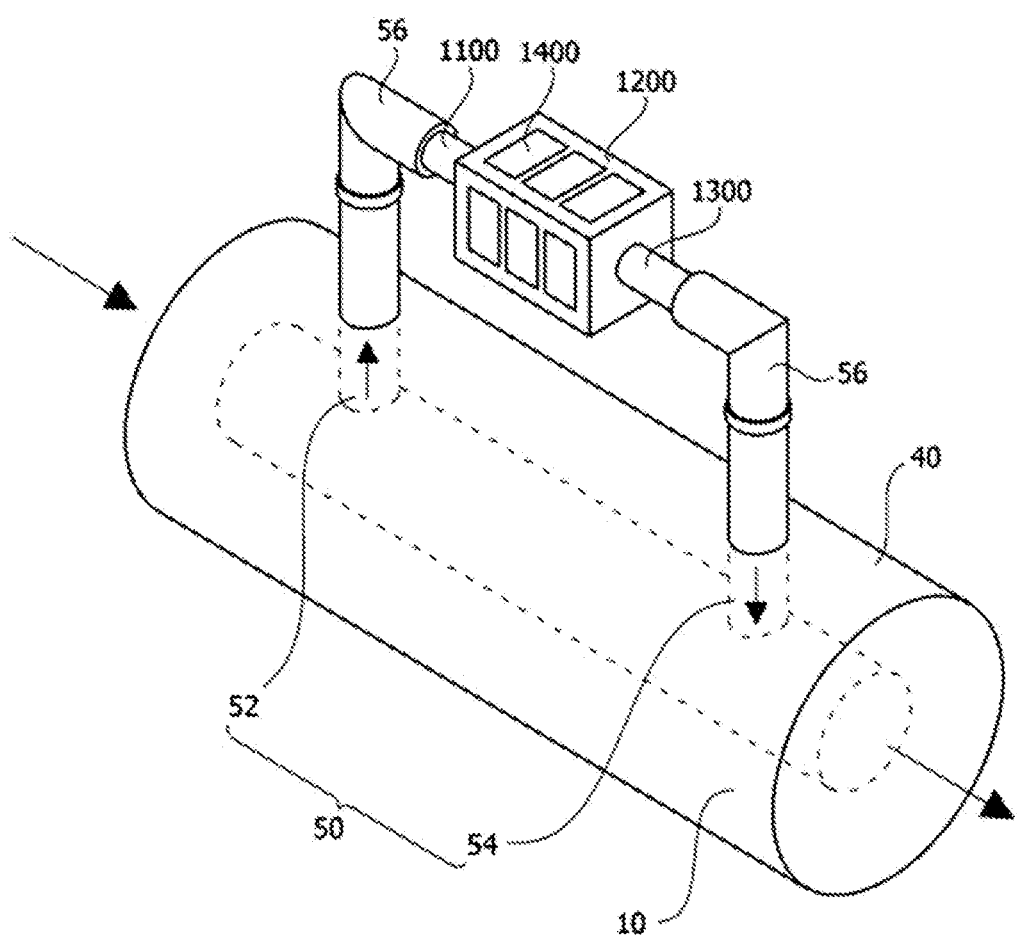
FIG. 3 represents a power-generating apparatus disposed in a fluid pipe according to an embodiment of this invention.
Figure 4:
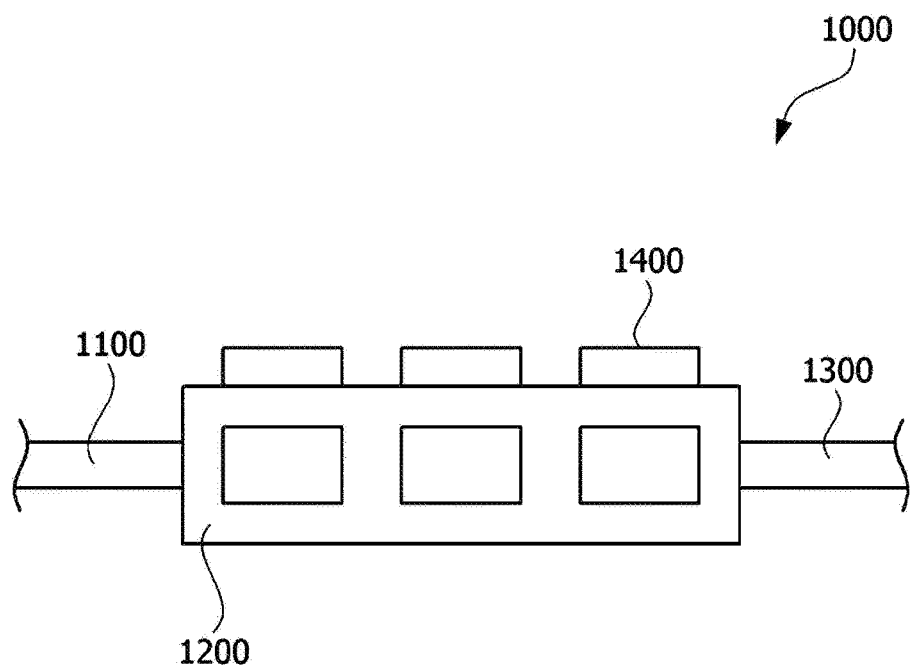
FIG. 4 represents a power-generating apparatus according to an embodiment of this invention.
Figure 5:
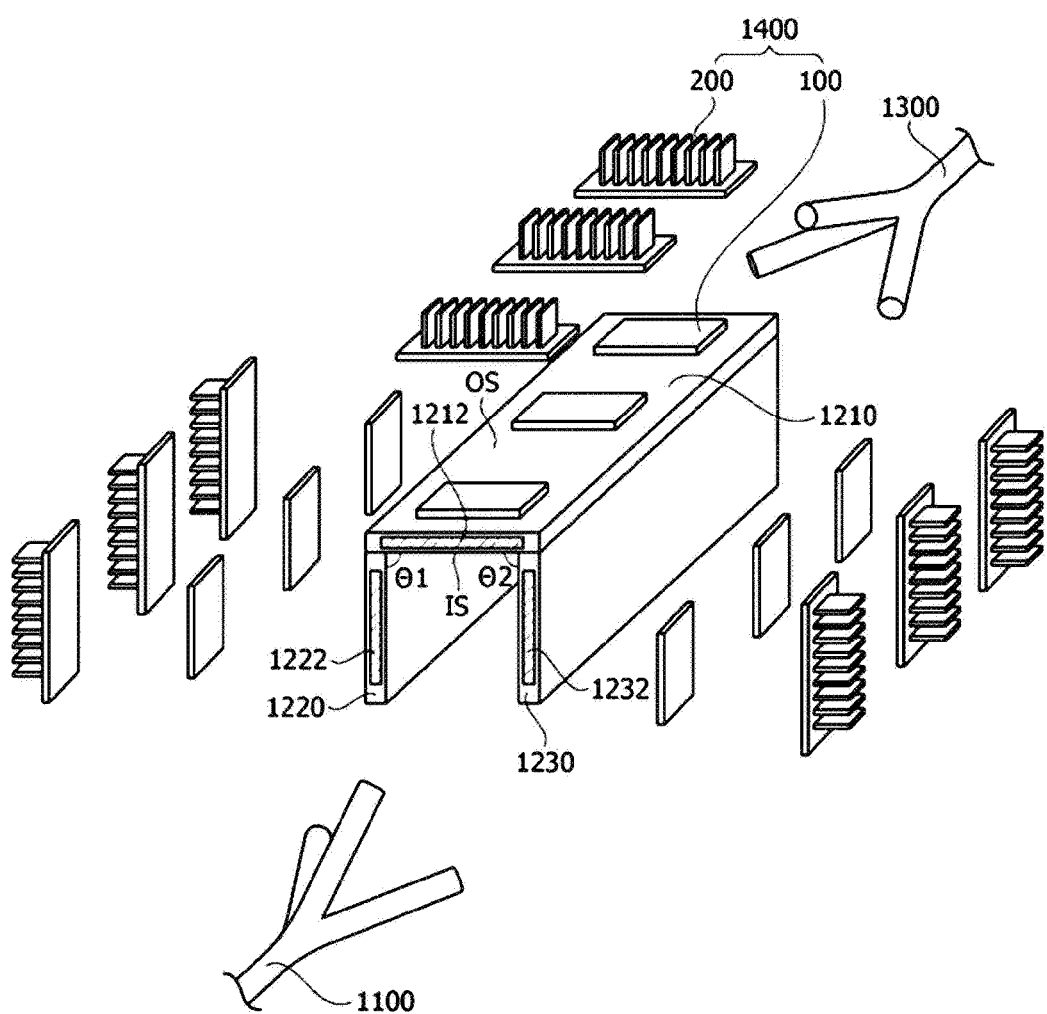
FIG. 5 represents an exploded perspective view of a part of the power-generating apparatus of FIG. 4.
Figure 6:
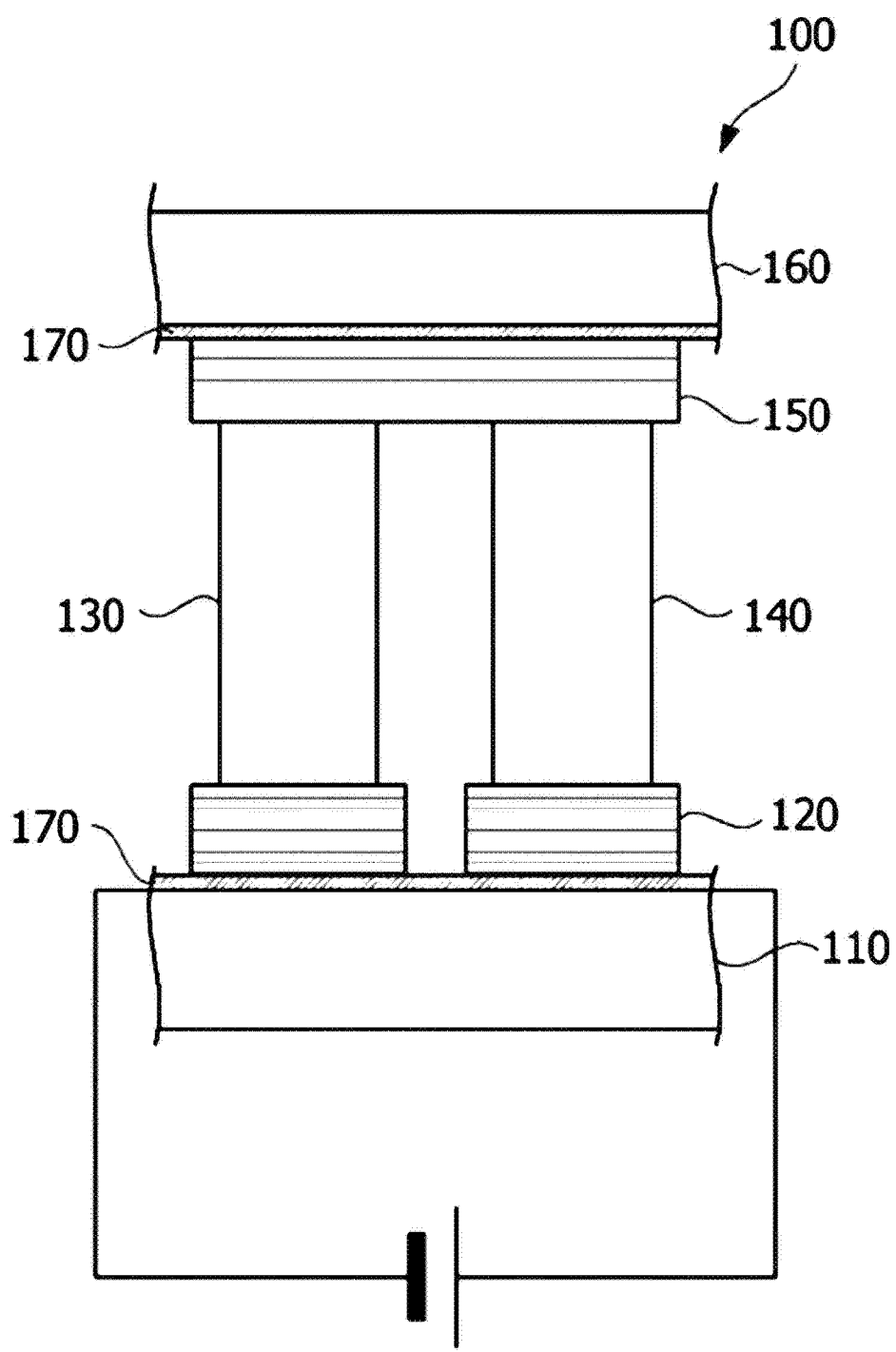
FIG. 6 is a cross-sectional view of a thermoelectric element included in the power-generating apparatus of FIG. 4.
Figure 7:
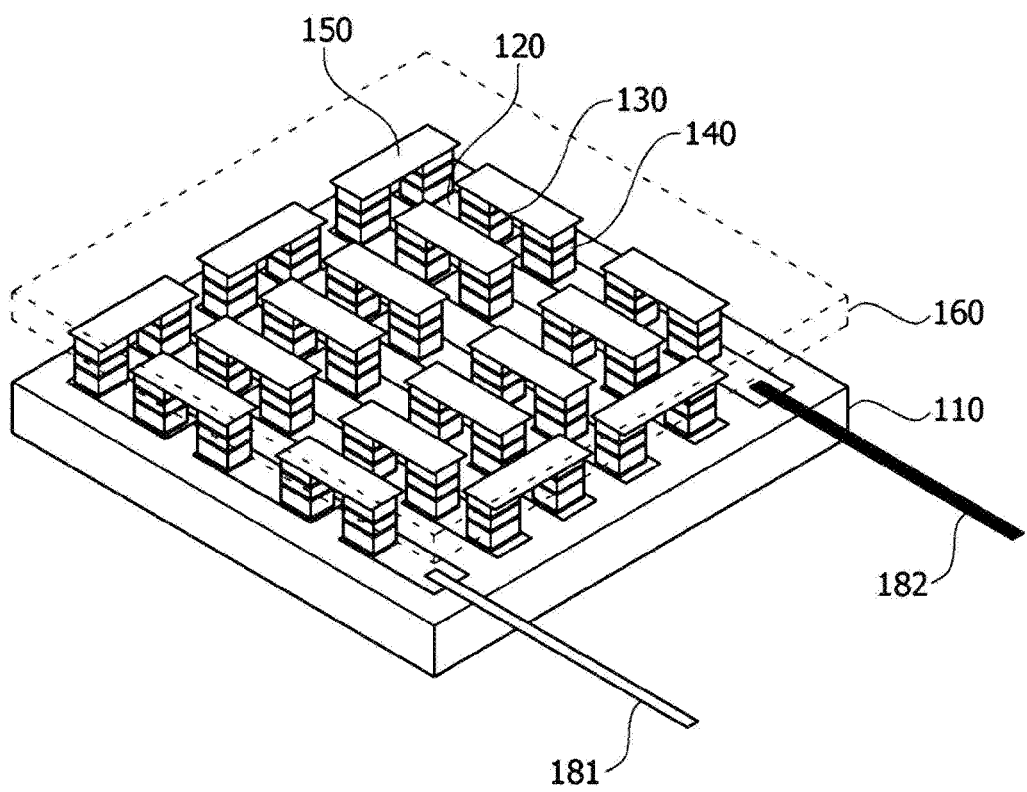
FIG. 7 is a perspective view of the thermoelectric element included in the power-generating apparatus of FIG. 4.
Figure 8:
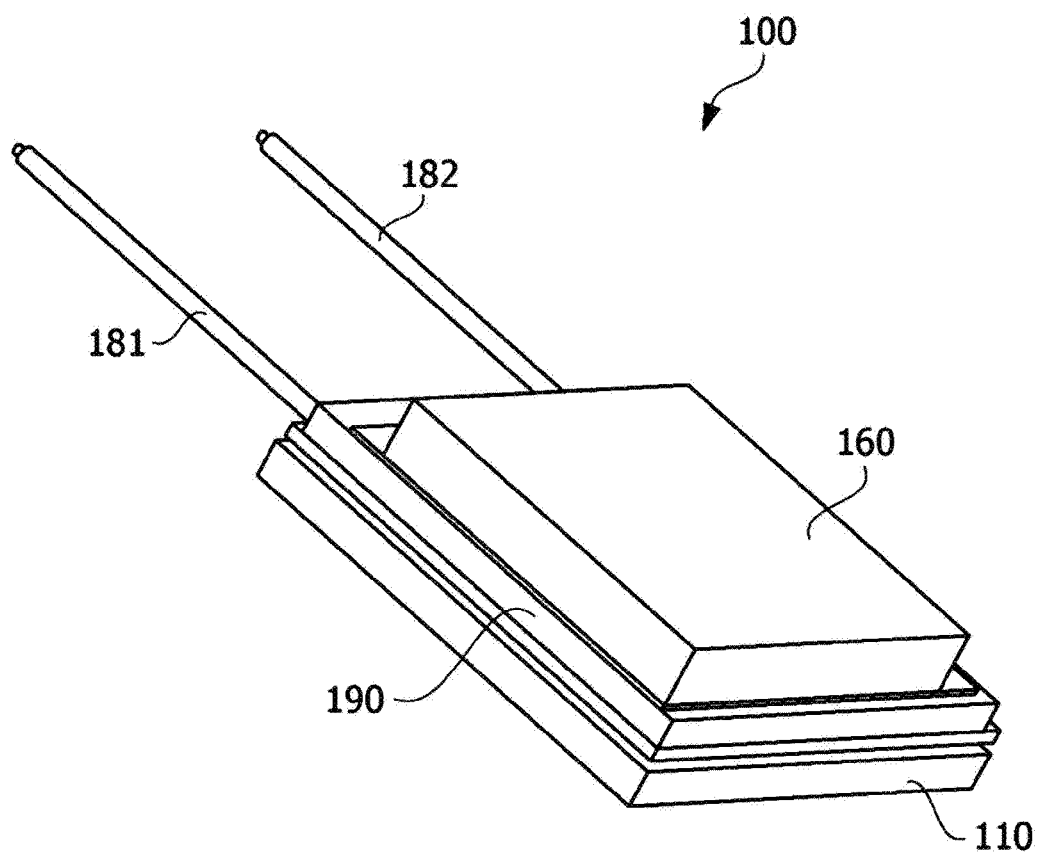
FIG. 8 is a perspective view in which a sealing member is added to the thermoelectric element of FIG. 7.
Figure 9:
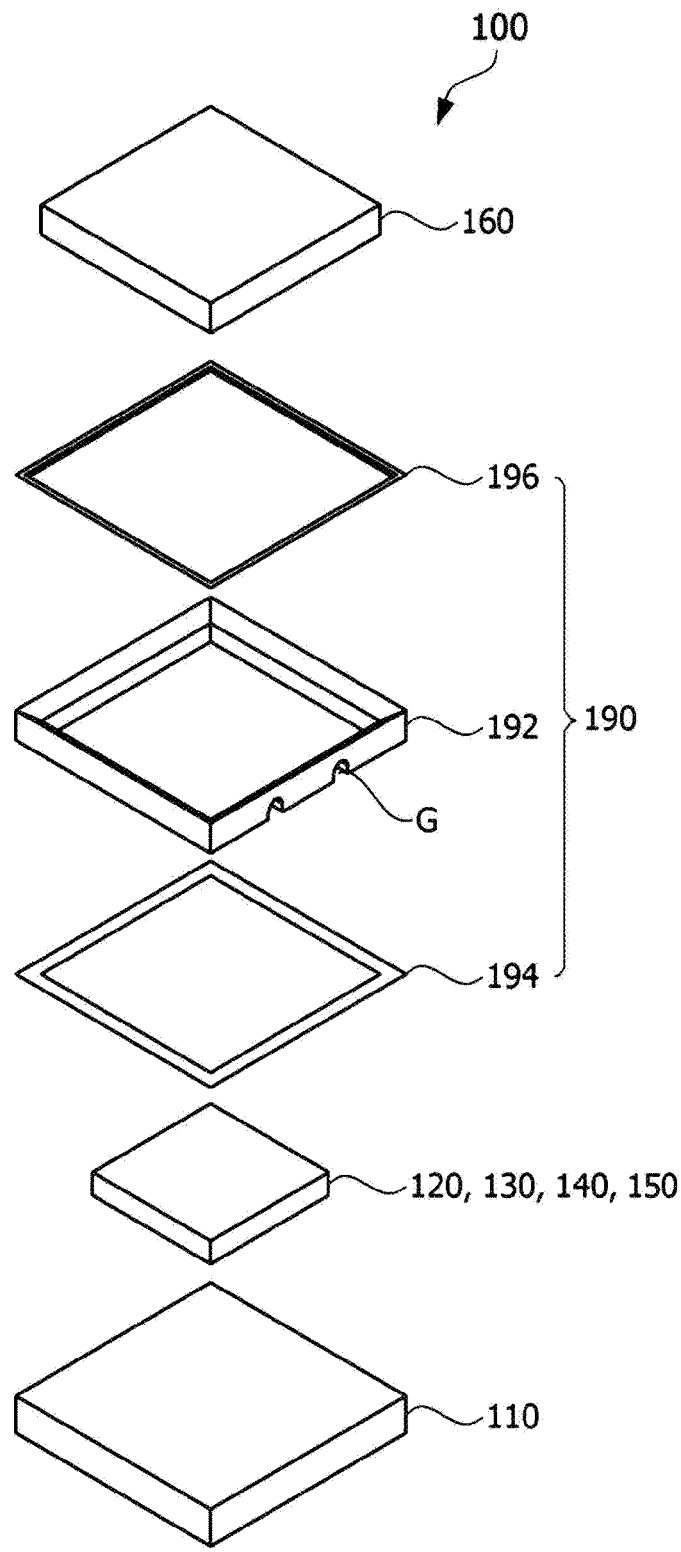
FIG. 9 is an exploded perspective view of the thermoelectric element of FIG. 8.

FIG. 3 shows a power-generating apparatus disposed at a fluid pipe according to an embodiment of this invention; FIG. 4 shows a power-generating apparatus according to an embodiment of this invention; and FIG. 5 shows an exploded perspective view of a part of the power-generating apparatus of FIG. 4. FIG. 6 is a cross-sectional view of a thermoelectric element included in the power-generating apparatus of FIG. 4, and FIG. 7 is a perspective view of the thermoelectric element included in the power-generating apparatus of FIG. 4. FIG. 8 is a perspective view in which a sealing member is added to the thermoelectric element of FIG. 7, and FIG. 9 is an exploded perspective view of the thermoelectric element of FIG. 7.

Referring to FIGS. 3 to 5, a high-temperature fluid may flow along the fluid pipe 10. Here, the high-temperature fluid may be, for example, a liquid or gas of 50° C. or higher, preferably 70° C. or higher, and more preferably 90° C. or higher. For example, the high-temperature fluid flowing along the fluid pipe 10 may be a hot water pipe for heating, a recovery pipe for heating, waste heat, and the like, but is not limited thereto.

A heat insulating material 40 may be disposed on the surface of the fluid pipe 10 so as to surround the surface of the fluid pipe 10. Accordingly, the heat of the fluid flowing along the fluid pipe 10 can reach the destination without being lost, and it is possible to inhibit the problem that the temperature around the fluid pipe 10 increases due to the heat of the fluid.

According to an embodiment of this invention, the bypass pipe 50 may be connected to the fluid pipe 10, and a portion of the fluid flowing along the fluid pipe 10 may flow through the bypass pipe 50.

The bypass pipe 50 may include a first bypass pipe 52 through which the fluid leaked from the fluid pipe 10 flows and a second bypass pipe 54 through which the fluid that has passed through the power-generating apparatus 1000 flows. The fluid flowing along the second bypass pipe 54 may be collected back into the fluid pipe 10.

The thermal insulating material 56 may also be disposed on the surface of the bypass pipe 50. Accordingly, it is possible to inhibit a problem that the heat of the fluid flowing along the bypass pipe 50 is lost to the outside, and it is possible to maximize the temperature difference $\Delta T$ of the power-generating apparatus 1000.

At this time, the cross-sectional area of the fluid pipe 10 may be 100 times or more, preferably 150 times or more, more preferably 200 times or more of the cross-sectional area of the bypass pipe 50. Accordingly, it is possible to generate an effective level of electricity without losing the original function of the fluid pipe 10.

According to an embodiment of this invention, the power-generating apparatus 1000 includes a first pipe 1100, a second pipe 1200, a third pipe 1300, and a plurality of thermoelectric modules 1400.

The first pipe 1100 is connected to the first bypass pipe 52, and a fluid flows at a predetermined flow rate through the first pipe 1100. That is, a portion of the fluid flowing along the fluid pipe 10 may flow into the first pipe 1100 through the first bypass pipe 52.

The second pipe 1200 is connected to the first pipe 1100, and the fluid having flowed along the first pipe 1100 may branch into a plurality of paths and pass through the second pipe 1200.

The fluid having been branched into a plurality of paths and passed through the second pipe 1200 may be collected again into the third pipe 1300 and then recovered to the fluid pipe 10 through the second bypass pipe 54.

Meanwhile, the second pipe 1200 may include a first region 1210, a second region 1220, and the second region 1220 and the third region 1230 may be disposed on both sides of the first region 1210 to form a predetermined angle, and a first branch pipe 1212, a second branch pipe 1222, and a third branch pipe 1232 may be formed in the first region 1210, the second region 1220, and the third region 1230, respectively. After the fluid flowing along the first pipe 1100 is branched into the first branch pipe 1212, the second branch pipe 1222, and the third branch pipe 1232, it may flow along the first branch pipe 1212, the second branch pipe 1222, and the third branch pipe 1232.

For example, the interior angle $\theta 1$ formed by the first region 1210 and the second region 1220 may be 80 to 100°, preferably 85 to 95°, more preferably 87 to 93°, even more preferably 89 to 91°. Likewise, the interior angle $\theta 2$ formed by the first region 1210 and the third region 1230 may be 80 to 100°, preferably 85 to 95°, more preferably 87 to 93°, even more preferably 89 to 91°.

Accordingly, the first region 1210, the second region 1220, and the third region 1230 may have a 'Π' shape.

At this time, at least one of the first region 1210, the second region 1220, and the third region 1230 may include a flat surface made of metal, on which the plurality of thermoelectric modules 1400 may be disposed. Alternatively, the first region 1210, the second region 1220, and the third region 1230 may be made of metal, and at least one of the first region 1210, the second region 1220, and the third region 1230 may include a flat surface, on which the plurality of thermoelectric modules 1400 may be disposed.

Here, the flat surface made of metal may be a wall surface of at least one of the first branch pipe 1212, the second branch pipe 1222, and the third branch pipe 1232, and accordingly, the heat of the fluid flowing through at least one of the first branch pipe 1212, the second branch pipe 1222, and the third branch pipe 1232 may be transferred to the plurality of thermoelectric modules 1400 through the flat surface made of metal.

As shown in FIG. 5, each thermoelectric module 1400 may include a thermoelectric element 100 and a heat sink 200 disposed on the thermoelectric element 100.

Referring to FIGS. 6 to 7, the thermoelectric element 100 includes a lower substrate 110, a lower electrode 120, a P-type thermoelectric leg 130, an N-type thermoelectric leg 140, an upper electrode 150, and an upper substrate 160.

The lower electrode 120 is disposed between the lower substrate 110 and the lower bottom surfaces of the P-type thermoelectric leg 130 and the N-type thermoelectric leg 140, and the upper electrode 150 is disposed between the upper substrate 160 and upper bottom surfaces of the P-type thermoelectric leg 130 and the N-type thermoelectric leg 140. Accordingly, the plurality of P-type thermoelectric legs 130 and the plurality of N-type thermoelectric legs 140 are electrically connected by the lower electrode 120 and the upper electrode 150. A pair of P-type thermoelectric leg 130 and N-type thermoelectric leg 140 disposed between the lower electrode 120 and the upper electrode 150 and electrically connected to each other may form a unit cell.

For example, when a voltage is applied to the lower electrode 120 and the upper electrode 150 through the lead wires 181 and 182, the substrate through which an electric current flows from the P-type thermoelectric leg 130 to the N-type thermoelectric leg 140 due to the Peltier effect can absorb heat and act as a cooling unit, and the substrate through which an electric current flows from the N-type thermoelectric leg 140 to the P-type thermoelectric leg 130 can be heated and act as a heat generating unit. Alternatively, if a temperature difference is applied between the lower electrode 120 and the upper electrode 150, charges in the P-type thermoelectric leg 130 and the N-type thermoelectric leg 140 move due to the Seebeck effect, and electricity can be generated.

Here, the P-type thermoelectric leg 130 and the N-type thermoelectric leg 140 may be bismuth telluride (Bi—Te)-based thermoelectric legs including bismuth (Bi) and tellurium (Te) as main raw materials. The P-type thermoelectric leg 130 may be a bismuthtelluride (Bi—Te)-based thermoelectric leg including at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may include Bi—Sb—Te in an amount of 99 to 99.999 wt %, which is a main raw material, based on the total weight as 100 wt %, and may include at least one of nickel (Ni), aluminum (Al), copper (Cu), silver (Ag), lead (Pb), boron (B), gallium (Ga), and indium (In) in an amount of 0.001 to 1 wt %. The N-type thermoelectric leg 140 may be a bismuthtelluride (Bi—Te)-based thermoelectric leg including at least one of selenium (Se), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may include Bi—Se—Te in an amount of 99 to 99.999 wt %, which is a main raw material, based on the total weight as 100 wt %, and may include at least one of nickel (Ni), aluminum (Al), copper (Cu), silver (Ag), lead (Pb), boron (B), gallium (Ga), and indium (In) in an amount of 0.001 to 1 wt %. Accordingly, in this specification, the thermoelectric leg may be referred to as a semiconductor structure, a semiconductor device, a semiconductor material layer, a conductive semiconductor structure, a thermoelectric structure, a thermoelectric material layer, or the like.

The P-type thermoelectric leg 130 and the N-type thermoelectric leg 140 may be formed in a bulk type or a stack type. In general, the bulk-type P-type thermoelectric leg 130 or the bulk-type N-type thermoelectric leg 140 may be obtained through the processes of manufacturing an ingot by heat-treating the thermoelectric material, grinding the ingot and sieving to obtain powder for the thermoelectric leg, sintering it, and cutting the sintered body. In this case, the P-type thermoelectric leg 130 and the N-type thermoelectric leg 140 may be polycrystalline thermoelectric legs. For polycrystalline thermoelectric legs, the powder for thermoelectric legs may be compressed to 100 MPa to 200 MPa when being sintered. For example, when the P-type thermoelectric leg 130 is sintered, the powder for the thermoelectric leg may be sintered at 100 to 150 MPa, preferably 110 to 140 MPa, more preferably 120 to 130 MPa. In addition, when the N-type thermoelectric leg 140 is sintered, the powder for the thermoelectric leg may be sintered at 150 to 200 MPa, preferably 160 to 195 MPa, more preferably 170 to 190 MPa. In this way, when the P-type thermoelectric leg 130 and the N-type thermoelectric leg 140 are polycrystalline thermoelectric legs, the strength of the P-type thermoelectric leg 130 and the N-type thermoelectric leg 140 can be increased. The laminated P-type thermoelectric leg 130 or the laminated N-type thermoelectric leg 140 may be obtained through the processes of forming a unit member by coating a paste containing a thermoelectric material on a sheet-shaped substrate, and then laminating the unit members and cut them.

In this case, the pair of P-type thermoelectric leg 130 and N-type thermoelectric leg 140 may have the same shape and volume, or may have different shapes and volumes. For example, since the electrical conductivity characteristics of the P-type thermoelectric leg 130 and the N-type thermoelectric leg 140 are different, the height or cross-sectional area of the N-type thermoelectric leg 140 may be formed differently from the height or cross-sectional area of the P-type thermoelectric leg 130.

In this case, the P-type thermoelectric leg 130 or the N-type thermoelectric leg 140 may have a cylindrical shape, a polygonal column shape, an elliptical column shape, or the like.

The performance of the thermoelectric element according to an embodiment of this invention may be expressed as a thermoelectric figure of merit (ZT). The thermoelectric figure of merit (ZT) may be expressed as in Equation (1).

$$ZT = \alpha^2 \cdot \sigma \cdot T/k \qquad \text{[Equation 1]}$$

where α denotes the Seebeck coefficient [V/K], σ denotes the electrical conductivity [S/m], and $\alpha^2\sigma$ denotes the power factor [W/mK²]. And, T denotes the temperature, and k denotes the thermal conductivity [W/mK]. k may be expressed as a·cp·ρ, where 'a' denotes the thermal diffusivity [cm²/S], cp denotes the specific heat [J/gK], and ρ denotes the density [g/cm³].

In order to obtain the thermoelectric figure of merit of the thermoelectric element, a Z value (V/K) is measured using a Z meter, and the thermoelectric figure of merit (ZT) can be calculated using the measured Z value.

Here, the lower electrode 120 disposed between the lower substrate 110 and both the P-type thermoelectric leg 130 and the N-type thermoelectric leg 140, and the upper electrode 150 disposed between the upper substrate 160 and both the P-type thermoelectric leg 130 and the N-type thermoelectric leg 140 may include at least one of copper (Cu), silver (Ag), aluminum (Al), and nickel (Ni), and may have a thickness of 0.01 mm to 0.3 mm. When the thickness of the lower electrode 120 or the upper electrode 150 is less than 0.01 mm, the function as an electrode may deteriorate and the electrical conduction performance may be lowered, and when it is greater than 0.3 mm, the conduction efficiency may be lowered due to an increase in resistance.

In addition, the lower substrate 110 and the upper substrate 160 facing each other may be metal substrates, and the thicknesses thereof may be 0.1 mm to 1.5 mm. When the thickness of the metal substrate is less than 0.1 mm or greater than 1.5 mm, heat dissipation characteristics or thermal conductivity may be excessively high, and thus the reliability of the thermoelectric element may be deteriorated. In addition, when the lower substrate 110 and the upper substrate 160 are metal substrates, the insulating layer 170 may be further respectively formed between the lower substrate 110 and the lower electrode 120 and between the upper substrate 160 and the upper electrode 150. The insulating layer 170 may include a material having a thermal conductivity of 1 to 20 W/mK.

In this case, the sizes of the lower substrate 110 and the upper substrate 160 may be formed differently. For example, the volume, thickness, or area of one of the lower substrate 110 and the upper substrate 160 may be formed to be greater than the volume, thickness, or area of the other of them. Accordingly, heat absorbing performance or heat dissipation performance of the thermoelectric element can be improved. Preferably, the volume, thickness, or area of the lower substrate 110 may be formed to be greater than at least one of the volume, thickness, or area of the upper substrate 160. At this time, if the lower substrate 110 is disposed in a high temperature region for the Seebeck effect, if it is applied as a heating region for the Peltier effect, or if a sealing member for protection of the thermoelectric element from the external environment, which will be described later, is disposed on the lower substrate 110, the lower substrate may have at least one of a volume, a thickness, and an area greater than that of the upper substrate 160. In this case, the area of the lower substrate 110 may be formed in a range of 1.2 to 5 times the area of the upper substrate 160. When the area of the lower substrate 110 is formed to be less than 1.2 times that of the upper substrate 160, the effect on the improvement of heat transfer efficiency is not high, while, when it exceeds 5 times, the heat transfer efficiency may be rather significantly reduced, and it may be difficult to maintain the basic shape of the thermoelectric module.

In addition, a heat dissipation pattern, for example, a concave-convex pattern, may be formed on at least one surface of the lower substrate 110 and the upper substrate 160. Accordingly, heat dissipation performance of the thermoelectric element can be improved. When the concave-convex pattern is formed on a surface in contact with the P-type thermoelectric leg 130 or the N-type thermoelectric leg 140, bonding characteristics between the thermoelectric leg and the substrate may also be improved. The thermoelectric element 100 includes a lower substrate 110, a lower electrode 120, a P-type thermoelectric leg 130, an N-type thermoelectric leg 140, an upper electrode 150, and an upper substrate 160.

As shown in FIGS. 8 to 9, a sealing member 190 may be further disposed between the lower substrate 110 and the upper substrate 160. The sealing member may be disposed on the side surfaces of the lower electrode 120, the P-type thermoelectric leg 130, the N-type thermoelectric leg 140, and the upper electrode 150 between the lower substrate 110 and the upper substrate 160. Accordingly, the lower electrode 120, the P-type thermoelectric leg 130, the N-type thermoelectric leg 140, and the upper electrode 150 may be sealed from external moisture, heat, contamination, and the like. Here, the sealing member 190 may include a sealing case 192, a sealing material 194 disposed between the sealing case 192 and the lower substrate 110, and a sealing material 196 disposed between the sealing case 192 and the upper substrate 160, wherein the sealing case 192 is spaced apart a predetermined distance from the outermost side of the plurality of lower electrodes 120, the outermost side of the plurality of P-type thermoelectric legs 130 and the plurality of N-type thermoelectric legs 140, and the outermost side of the plurality of upper electrodes 150. In this way, the sealing case 192 may contact the lower substrate 110 and the upper substrate 160 via the sealing materials 194 and 196. Accordingly, it is possible to inhibit a problem that the temperature difference between the lower substrate 110 and the upper substrate 160 is lowered since the heat conduction occurs through the sealing case 192 therebetween when the sealing case 192 is in direct contact with the lower substrate 110 and the upper substrate 160. Here, the sealing materials 194 and 196 may include at least one of an epoxy resin and a silicone resin, or a tape with at least one of an epoxy resin and a silicone resin applied to both surfaces thereof. The sealing materials 194 and 196 may serve to seal between the sealing case 192 and the lower substrate 110 and between the sealing case 192 and the upper substrate 160, may increase the sealing effect at the lower electrode 120, the P-type thermoelectric leg 130, the N-type thermoelectric leg 140, and the upper electrode 150, and may be used interchangeably with a finishing material, a finishing layer, a waterproofing material, a waterproofing layer, and the like. Here, the sealing material 194 for sealing between the sealing case 192 and the lower substrate 110 may be disposed on the upper surface of the lower substrate 110, and the sealing material 196 for sealing between the sealing case 192 and the upper substrate 160 may be disposed on the side surfaces of the upper substrate 160. To this end, the area of the lower substrate 110 may be greater than that of the upper substrate 160. Meanwhile, a guide groove G for extending the lead wires 180 and 182 connected to the electrode may be formed in the sealing case 192. To this end, the sealing case 192 may be an injection-molded product made of plastic or the like, and may be used interchangeably with a sealing cover. However, the above description of the sealing member is merely an example, and the sealing member may be modified in various forms. Although not shown, a thermal insulating material may be further included to surround the sealing member. Alternatively, the sealing member may include a thermal insulating component.

In the above, although the terms lower substrate 110, lower electrode 120, upper electrode 150, and upper substrate 160 are used, these are only exemplarily referred to as upper or lower for ease of understanding and convenience of explanation, and the positions thereof may be reversed so that the lower substrate 110 and the lower electrode 120 are disposed at an upper side, and the upper electrode 150 and the upper substrate 160 are disposed at a lower side.

Referring back to FIGS. 3 to 5, the first surface of each thermoelectric element 100, for example, the lower substrate 110 may be in contact with a flat surface made of metal, and the heat sink 200 may be disposed on a second surface thereof opposite to the first surface, for example, the upper substrate 160.

Accordingly, the first surface of each thermoelectric element 100, for example, the lower substrate 110, acts as the high-temperature part, and the second surface, for example, the upper substrate 160, acts as the low-temperature part, and electricity can be generated by using the temperature difference ΔT between the high-temperature part and the low-temperature part.

In this case, as described above, if the flat surface made of metal is the wall surface of at least one of the first branch pipe 1212, the second branch pipe 1222, and the third branch pipe 1232, heat from the fluid flowing through at least one of the first branch pipe 1212, the second branch pipe 1222 and the third branch pipe 1232 may be transferred to the lower substrate 110 of each thermoelectric element 100 through the flat surface made of metal, thereby increasing the temperature difference ΔT between the high-temperature part and the low-temperature part.

Also, according to an embodiment of this invention, the plurality of thermoelectric modules 1400 may be disposed on at least one of the outer surfaces of each of the first region 1210, the second region 1220, and the third region 1230. Here, an outer surface OS may mean a surface opposite to an inner surface IS disposed in a space formed by the first region 1210, the second region 1220, and the third region 1230, and may be an outward facing surface. In other words, surfaces of the first region 1210, the second region 1220 and the third region 1230 which are arranged so as to face toward each other or oppose each other may be referred to as the inner surfaces IS, and surfaces thereof facing outward may be referred to as the outer surfaces OS.

As such, when the plurality of thermoelectric modules 1400 are disposed on at least one of the outer surfaces of each of the first region 1210, the second region 1220, and the third region 1230, the heat sink 200 can be easily cooled, and thus the temperature difference ΔT between the high-temperature part and the low-temperature part may be further increased. As shown, the plurality of thermoelectric modules 1400 may be disposed to be spaced apart from each other on at least one of the outer surfaces of the first region 1210, the second region 1220, and the third region 1230. Although not shown, a thermal insulating member may be further disposed on the side surface of the thermoelectric module 1400 on at least one of the outer surfaces of the first region 1210, the second region 1220, and the third region 1230. According to this, since the spaced region between the plurality of thermoelectric modules 1400 may be filled with the thermal insulating member, heat of the fluid passing through the second pipe 1200 can be inhibited from being lost to the outside, thereby maximizing the temperature between the low-temperature part and the high-temperature part of the thermoelectric module 1400.

Figure 10:
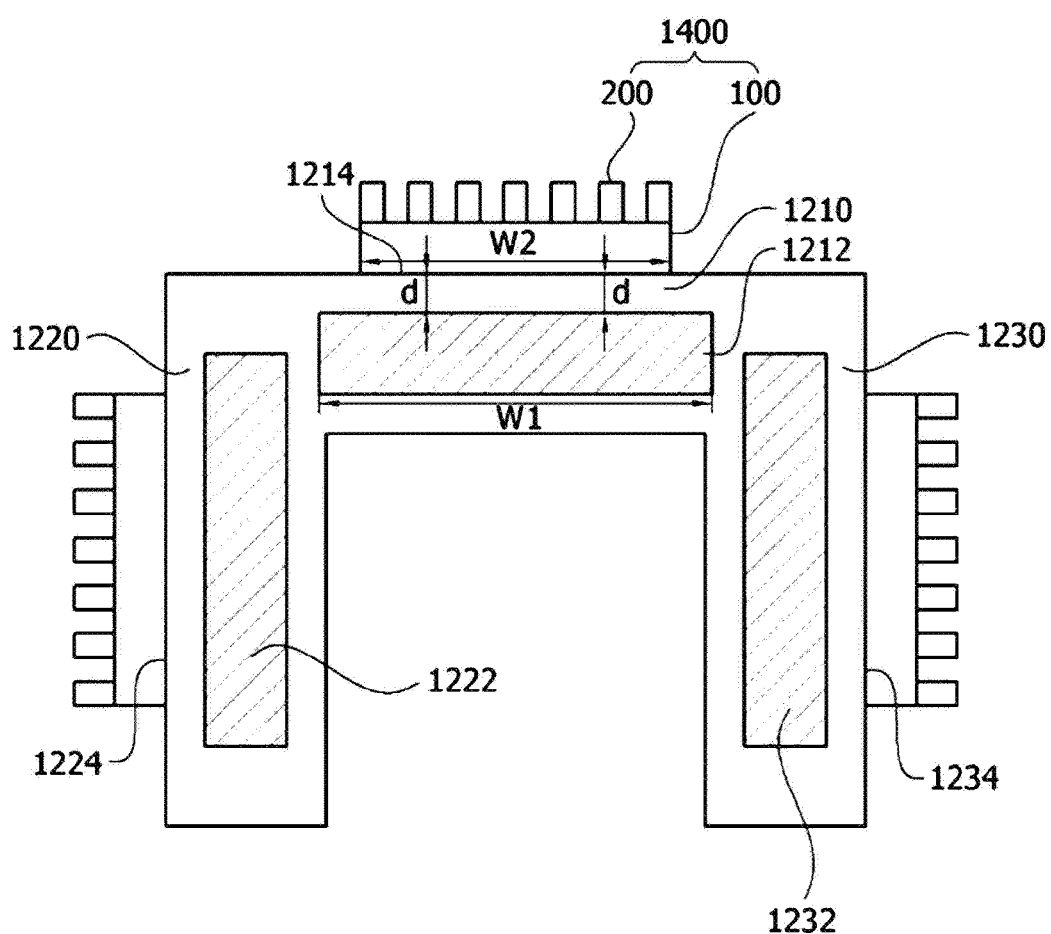
FIGS. 10 to 12 represent cross-sectional views of a second pipe and a thermoelectric module of a power-generating apparatus according to an embodiment of this invention.
Figure 11:
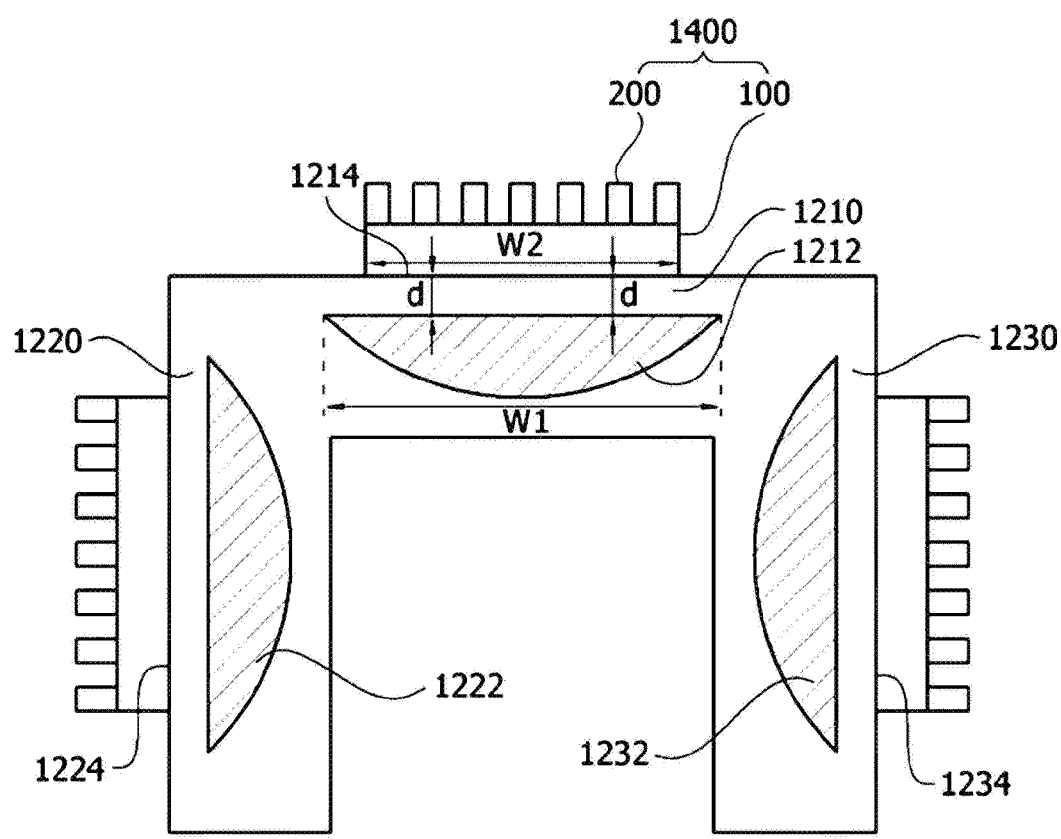
Figure 12:
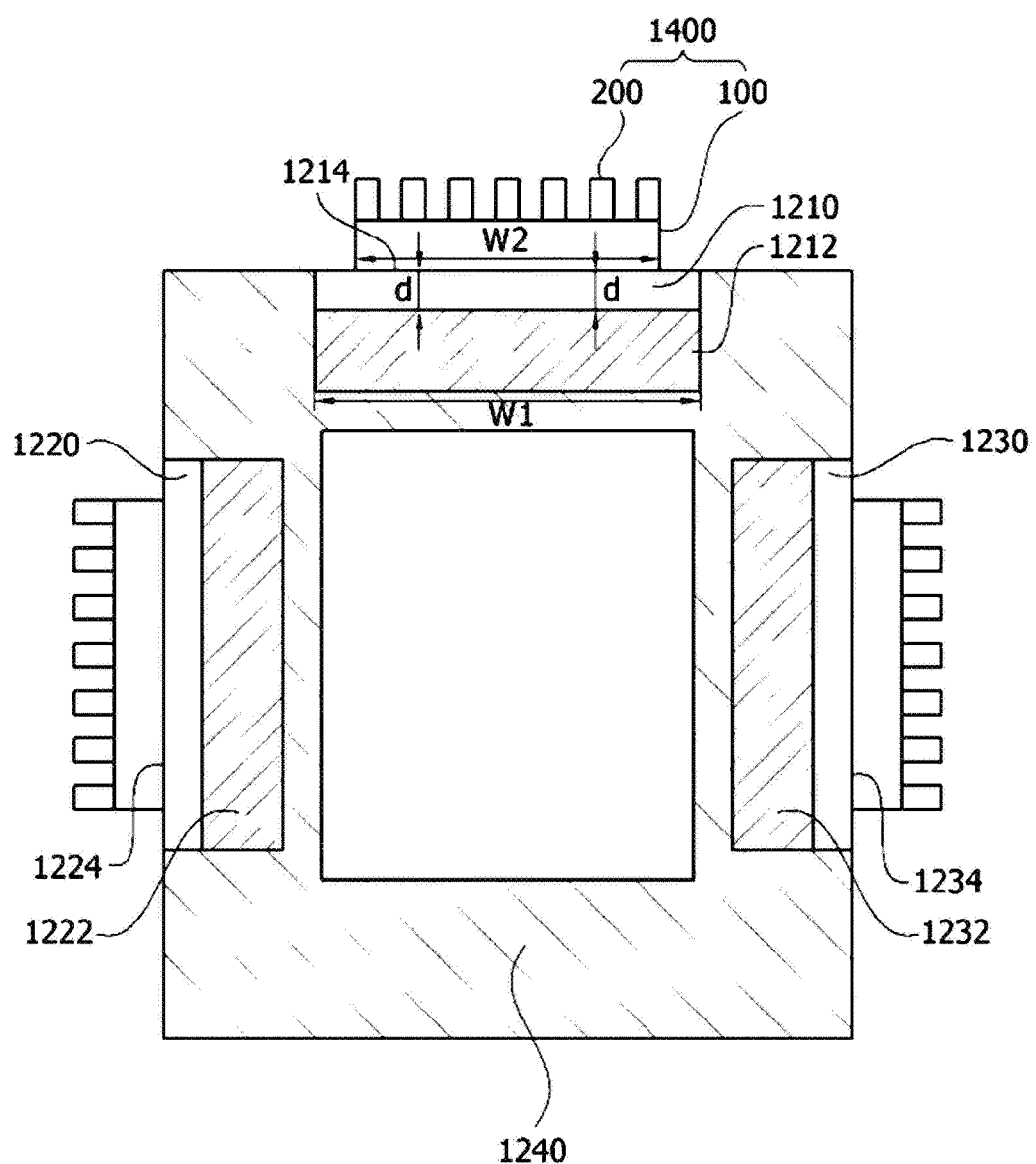

FIGS. 10 to 12 represent cross-sectional views of a second pipe and a thermoelectric module of a power-generating apparatus according to an embodiment of this invention.

Referring to FIGS. 10 to 11, the second pipe 1200 includes a first region 1210, a second region 1220, and a third region 1230, and a first branch pipe 1212, a second branch pipe 1222, and a third branch pipe 1232 may be formed in the first region 1210, the second region 1220, and the third region 1230, respectively. In addition, the thermoelectric modules 1400 may be disposed on flat surfaces 1214, 1224 and 1234 made of metal in the first region 1210, the second region 1220, and the third region 1230.

At this time, as shown in FIG. 10, the cross-sections of the first branch pipe 1212, the second branch pipe 1222, and the third branch pipe 1232 may have a rectangular shape. In this case, the width W1 of each of the first branch pipe 1212, the second branch pipe 1222, and the third branch pipe 1232 may be greater than the width W2 of the thermoelectric module 1400. Here, the width W1 of each of the first branch pipe 1212, the second branch pipe 1222, and the third branch pipe 1232 may mean a long axis in the rectangular cross-section. Accordingly, since the first branch pipe 1212, the second branch pipe 1222, and the third branch pipe 1232 can cover the entire area of the thermoelectric module 1400, the power generation performance of the thermoelectric module 1400 can be improved.

Additionally, the distance d between one surface of at least one of the first branch pipe 1212, the second branch pipe 1222 and the third branch pipe 1232, and the outer surface of at least one of the first region 1210, the second region 1220 and the third region 1230 may be uniform. Here, one surface of at least one of the first branch pipe 1212, the second branch pipe 1222, and the third branch pipe 1232 may be a surface on which the thermoelectric module 1400 is disposed. Accordingly, since the heat transferred from the fluid to the thermoelectric module 1400 is uniform, the power generation performance of the thermoelectric module 1400 can be improved.

Alternatively, as shown in FIG. 11, at least some of the surfaces in the cross-sections of the first branch pipe 1212, the second branch pipe 1222 and the third branch pipe 1232 except for the surface on which the thermoelectric module 1400 is disposed may also be curved. Accordingly, the flow rate of the fluid passing through the first branch pipe 1212, the second branch pipe 1222, and the third branch pipe 1232 can be controlled.

Alternatively, referring to FIG. 12, the second pipe 1200 may include a first region 1210, a second region 1220, a third region 1230 and a fourth region 1240, wherein the first region 1210, the second region 1220, the third region 1230 and the fourth region 1240 may be connected to each other, and wherein a first branch pipe 1212, a second branch pipe 1222 and a third branch pipe 1232 may be formed in the first region 1210, the second region 1220, and the third region 1230, respectively. In this case, in the first region 1210, the second region 1220, the third region 1230, and the fourth region 1240, surfaces other than the surface on which the thermoelectric module 1400 is disposed may be formed of a thermal insulating material. Accordingly, the heat from the fluid passing through the second pipe 1200 is not lost to the surroundings, and the temperature of the high-temperature part of the thermoelectric module 1400 can be made as high as possible.

Meanwhile, according to another embodiment of this invention, a cooling unit may be further included for further increasing the temperature difference ΔT between the low-temperature part and the high-temperature part of the thermoelectric element.

Figure 13:
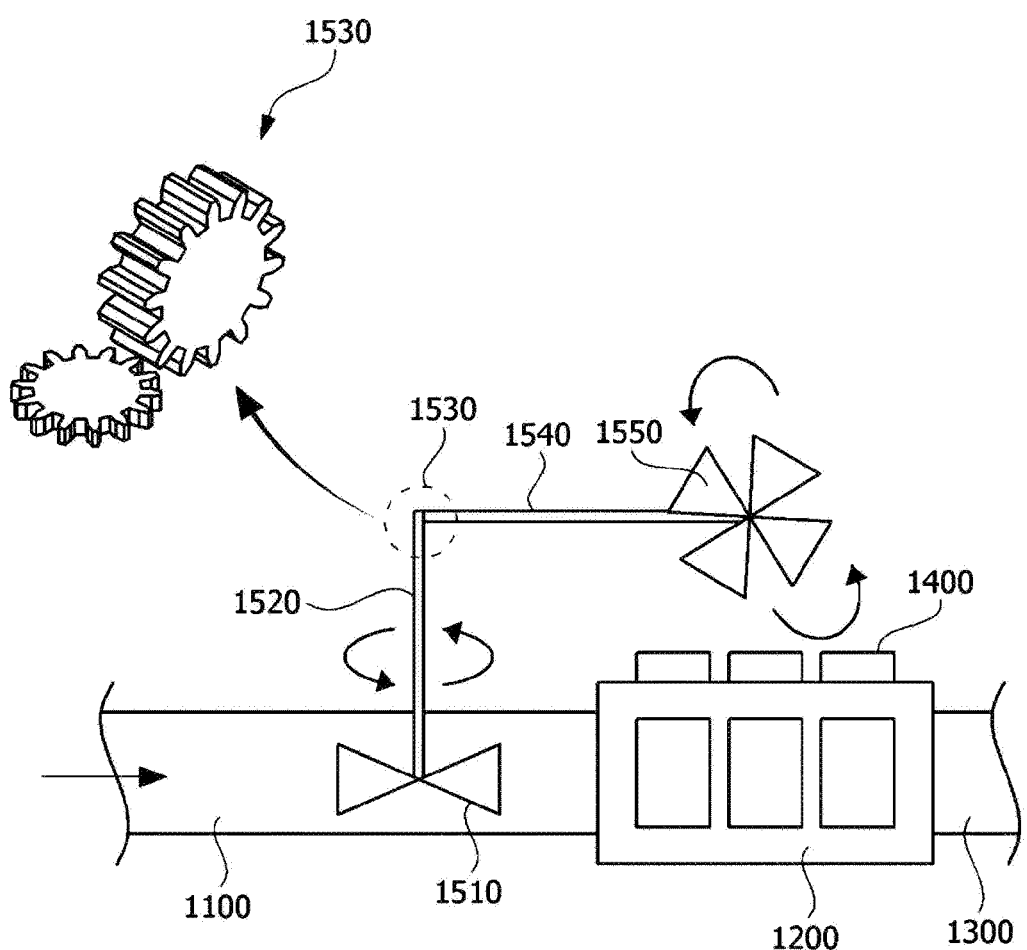
FIG. 13 represents a power-generating apparatus according to another embodiment of this invention.

FIG. 13 represents a power-generating apparatus according to another embodiment of this invention. Duplicate descriptions of the same contents as those described with reference to FIGS. 3 to 12 will be omitted.

Referring to FIG. 13, a thermal converter 1000 further includes a cooling unit 1500 which is driven using the flow rate of the fluid flowing along the first pipe 1100 and cools a heat sink 200 of the thermoelectric module 1400.

According to an embodiment of this invention, the cooling unit 1500 may include a first fan 1510, a first rotation shaft 1520, gears 1530, a second rotation shaft 1540, and a second fan 1550.

The first fan 1510 may be disposed in the first pipe 1100, and may be rotated by the fluid flowing along the first pipe 1100. In addition, the first rotation shaft 1520 may be connected to the first fan 1510 and extend out of the first pipe 1100, and may rotate together with the first fan 1510. In this case, the space between the first rotation shaft 1520 and the first pipe 1100 may be sealed.

Meanwhile, the gears 1530 may be connected to the first rotation shaft 1520, and the second rotation shaft 1540 may be connected to the gears 1530. Accordingly, the second rotation shaft 1540 may rotate in a direction different from that of the first rotation shaft 1520. For example, the second rotation shaft 1540 may rotate in a direction different from that of the first rotation shaft 1520 by about 90°. In addition, a second fan 1550 may be connected to the second rotation shaft 1540, and the second fan 1550 may rotate together with the second rotation shaft 1540. In this case, the second fan 1550 may be disposed near the heat sink 200. Due to the rotation of the second fan 1550, the air around the second fan 1550 may be cooled, thereby cooling the heat sink 200 too. In this case, the wind speed of the second fan 1550 may be 3.7 m/s or more, preferably 4 m/s or more, and more preferably 5 m/s or more.

According to this, it is possible to cool the heat sink 200 using the energy of the flow rate without a separate external power source, and accordingly, the temperature difference ΔT between the high-temperature part and the low-temperature part can be maximized.

In FIG. 13, the cooling unit is shown as being one in number, but is not limited thereto. When the plurality of thermoelectric modules 1400 are disposed in the first region 1210, the second region 1220, and the third region 1230, the cooling unit 1500 may be disposed for each region.

Electricity obtained from the power-generating apparatus according to an embodiment of this invention may be supplied to various electronic devices such as a sensing device around the power-generating apparatus. Accordingly, the remaining energy may be utilized, and electrical wiring work may be easily performed.

Figure 14:
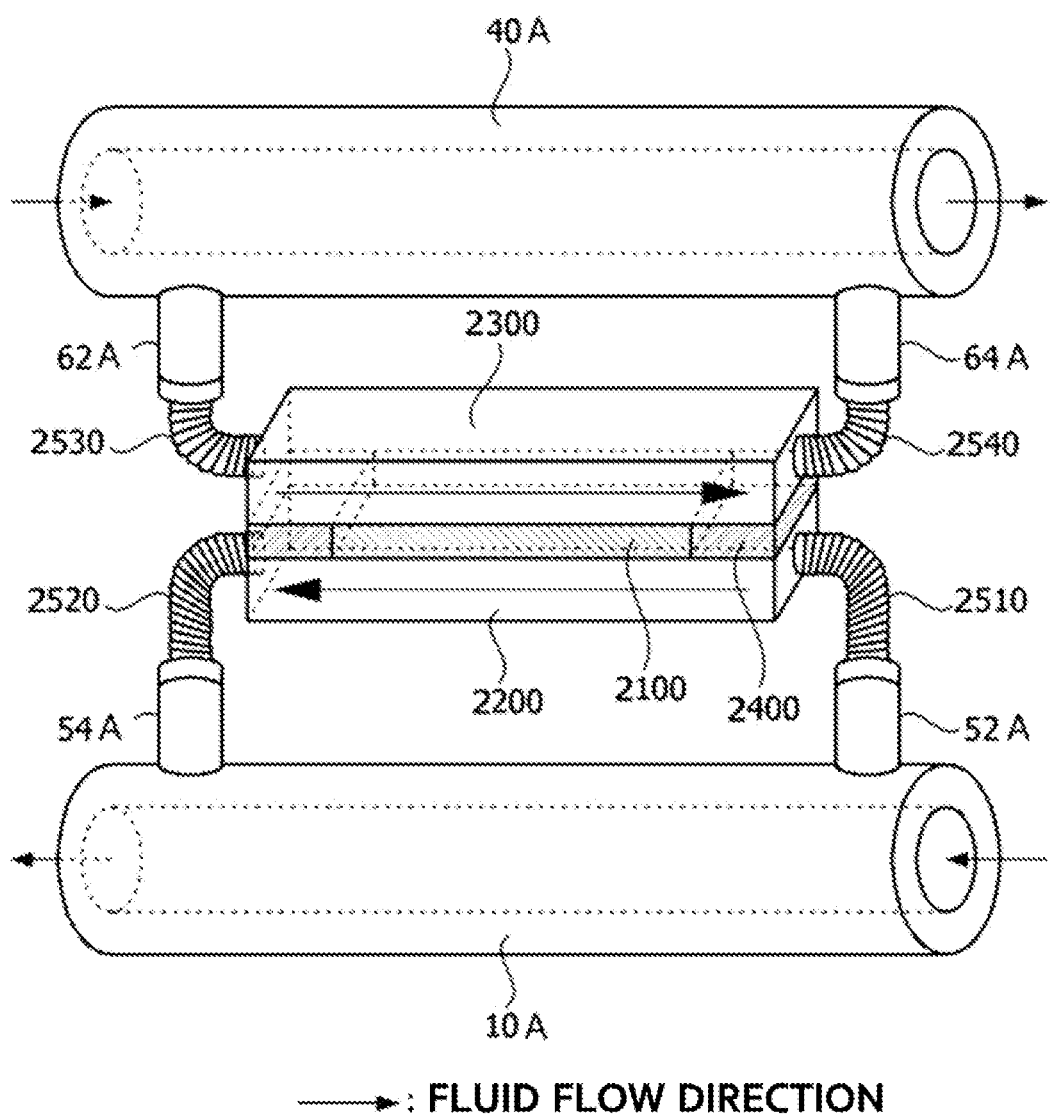
FIG. 14 is a perspective view of a power-generating system including a power-generating apparatus according to another embodiment of this invention.
Figure 15:
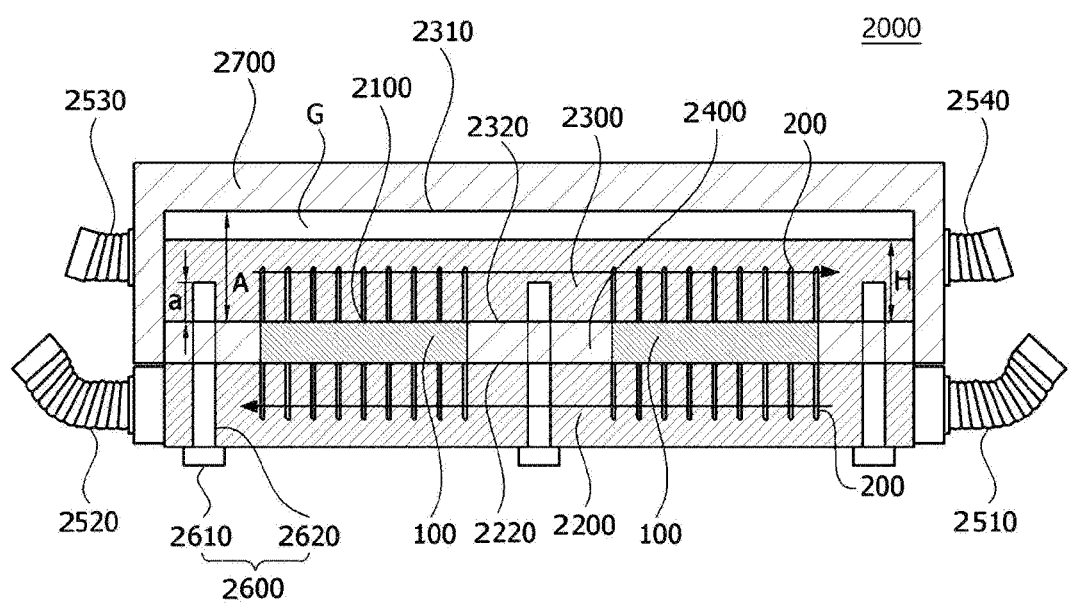
FIG. 15 is a cross-sectional view of the power-generating apparatus according to another embodiment of this invention.
Figure 16A:
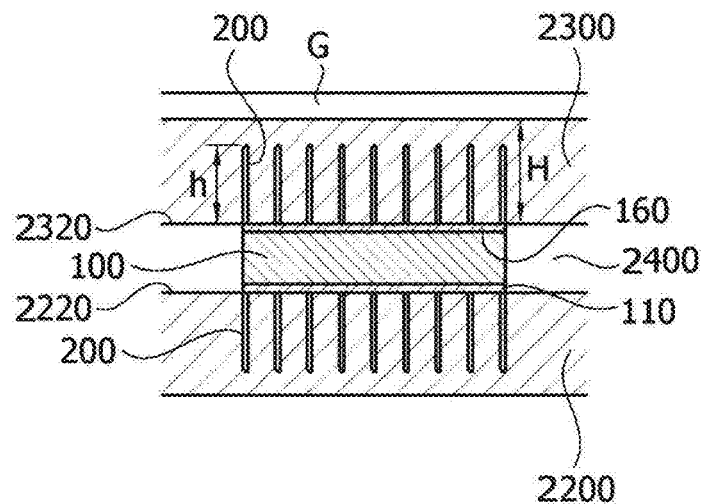
FIGS. 16A-16C are cross-sectional views of a thermoelectric module and pipes in a power-generating apparatus according to another embodiment of this invention.
Figure 16B:
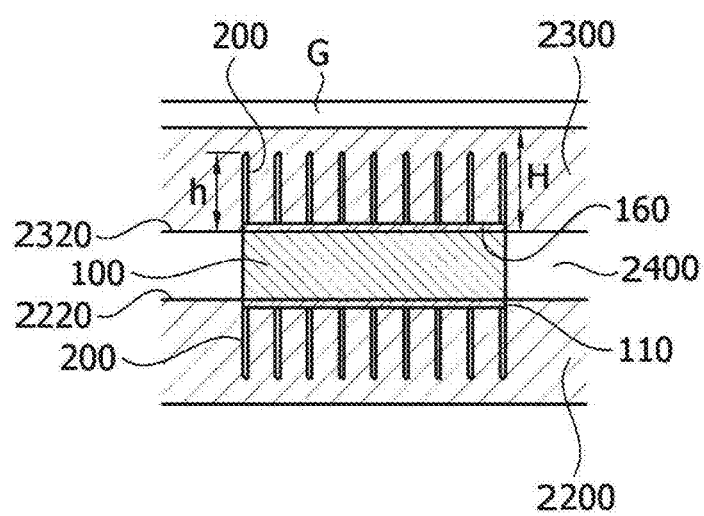
Figure 16C:
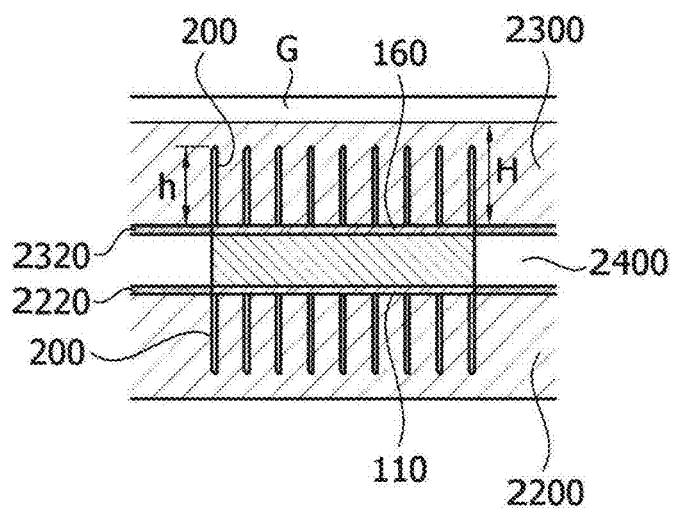
Figure 17:
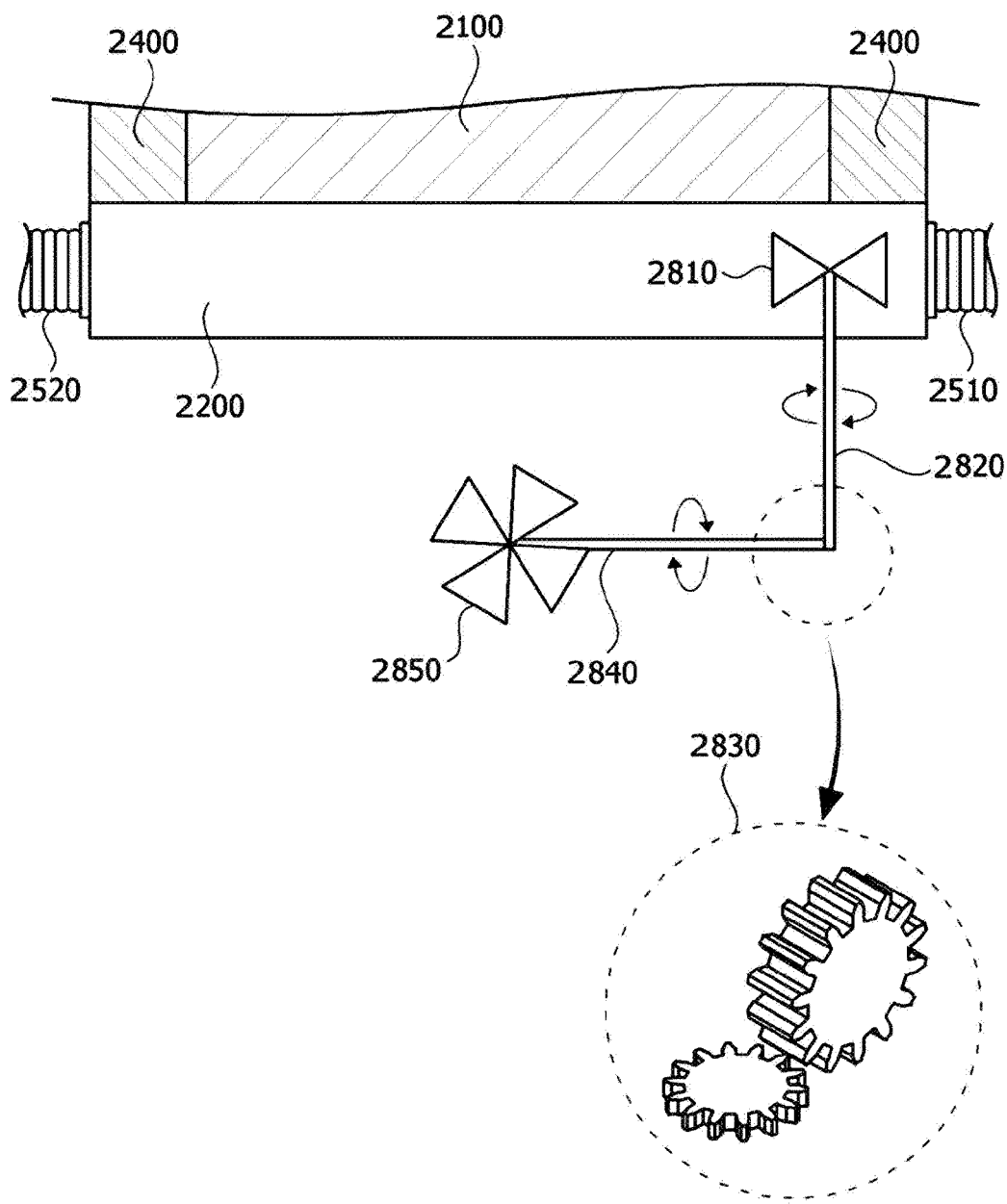
FIG. 17 is a view in which a cooling unit is added to the power-generating apparatus according to another embodiment of this invention.

FIG. 14 is a perspective view of a power-generating system including a power-generating apparatus according to another embodiment of this invention, and FIG. 15 is a cross-sectional view of the power-generating apparatus according to another embodiment of this invention. The same contents as those described with reference to FIGS. 5 to 8 may be applied to the thermoelectric element included in the power-generating apparatus according to the embodiment of FIGS. 14 to 15. FIGS. 16A-16C are cross-sectional views of a thermoelectric module and piping in a power-generating apparatus according to another embodiment of this invention, and FIG. 17 is a diagram in which a cooling unit is added to the power-generating apparatus according to another embodiment of this invention.

Referring to FIGS. 14 to 15, a predetermined fluid may flow along the first fluid pipe 10A and the second fluid pipe 40A. Here, the fluid may be a liquid or a gas. In this case, the temperature of the fluid flowing along the first fluid pipe 10A and the temperature of the fluid flowing along the second fluid pipe 40A may be different from each other. For example, the temperature of the fluid flowing along the first fluid pipe 10A may be lower than that of the fluid flowing along the second fluid pipe 40A. The power-generating apparatus 2000 according to an embodiment of this invention may generate electricity by using a temperature difference between the first fluid pipe 10A and the second fluid pipe 40A.

For example, the second fluid pipe 40A may be a supply pipe for supplying heat, and the first fluid pipe 10A may be a return pipe through which the fluid returns after having supplied heat. The term "supply pipe" may be used interchangeably with "heat supply pipe", "hot water pipe", "heat transport pipe", or the like, and the term "return pipe" may be used interchangeably with "recovery pipe" or the like. For example, the supply pipe and the return pipe may be for heating, but are not limited thereto. When the first fluid pipe 10A and the second fluid pipe 40A may be spaced apart from each other at a predetermined interval in the same space, and the temperature difference between the fluid flowing along the first fluid pipe 10A and the fluid flowing along the second fluid pipe 40A is at least a predetermined level, all the power-generating apparatuses according to the embodiment of this invention can be applied. When the second fluid pipe 40A is the supply pipe and the first fluid pipe 10A is the return pipe, the direction of the fluid flowing along the second fluid pipe 40A and the direction of the fluid flowing along the first fluid pipe 10A may be different from each other. For example, the direction of the fluid flowing along the second fluid pipe 40A and the direction of the fluid flowing along the first fluid pipe 10A may be parallel, but opposite to each other.

In this case, a thermal insulating material (not shown) may be disposed on the surface of the first fluid pipe 10A so as to wrap around the surface of the first fluid pipe 10A. Accordingly, the heat of the fluid flowing along the first fluid pipe 10A can reach the destination without being lost to the surroundings, and it is possible to inhibit the problem that the temperature around the first fluid pipe 10A increases due to the heat from the fluid therein. Similarly, a thermal insulating material (not shown) may be disposed on the surface of the second fluid pipe 40A so as to wrap around the surface of the second fluid pipe 40A. Accordingly, the heat of the fluid flowing along the second fluid pipe 40A can reach the destination without being lost to the surroundings, and it is possible to inhibit the problem that the temperature around the second fluid pipe 40A increases due to the heat from the fluid therein.

According to an embodiment of this invention, a first bypass pipe 50A may be connected to the first fluid pipe 10A, and a portion of the fluid flowing along the first fluid pipe 10A may flow through the first bypass pipe 50A.

The first bypass pipe 50A may include a first outlet bypass pipe 52A through which the fluid discharged from the first fluid pipe 10A flows, and a first inlet bypass pipe 54A through which the fluid that has passed through the power-generating apparatus 2000 flows back into the first fluid pipe 10A.

In this case, the cross-sectional area of the first fluid pipe 10A may be 100 times or more, preferably 150 times or more, more preferably 200 times or more, the cross-sectional area of the first bypass pipe 50A. Accordingly, it is possible to generate an effective level of electricity without losing the original function of the first fluid pipe 10A.

Similarly, a second bypass pipe 60A may be connected to the second fluid pipe 40A, and a portion of the fluid flowing along the second fluid pipe 40A may flow through the second bypass pipe 60A.

The second bypass pipe 60A may include a second outlet bypass pipe 62A through which the fluid discharged from the second fluid pipe 40A flows, and a second inlet bypass pipe 64A through which the fluid that has passed through the power-generating apparatus 2000 flows back into the second fluid pipe 40A. Although not shown, a thermal insulating material may also be disposed on the surface of the second bypass pipe 60A. Accordingly, it is possible to inhibit a problem that the heat of the fluid flowing along the second bypass pipe 60A is lost to the outside, and it is possible to maximize the temperature difference ΔT of the power-generating apparatus 2000. In this case, the cross-sectional area of the second fluid pipe 40A may be 100 times or more, preferably 150 times or more, more preferably 200 times or more, the cross-sectional area of the second bypass pipe 60A. Accordingly, it is possible to generate an effective level of electricity without losing the original function of the second fluid pipe 40A.

According to an embodiment of this invention, the power-generating apparatus 2000 includes a thermoelectric element 2100, a first housing 2200, a second housing 2300, and a first thermal insulating member 2400. And, the power-generating apparatus 2000 according to an embodiment of this invention includes a first connection inlet pipe 2510, a first connection discharge pipe 2520, a second connection inlet pipe 2530, and a second connection discharge pipe 2540.

In this case, the first housing 2200 accommodates the first fluid branched from the first fluid pipe 10A, and the second housing 2300 receives the second fluid branched from the second fluid pipe 40A, and the first housing 2200 and the second housing 2300 may be disposed to face each other. Each of the first housing 2200 and the second housing 2300 is a hollow tube, and a fluid may flow along the hollow tube. Accordingly, the terms "first housing 2200" and "second housing 2300" may be used interchangeably with "first pipe 2200" and "second pipe 2300". The first fluid flowing out from the first fluid pipe 10A through the first outlet bypass pipe 52A flows into the first housing 2200, and may be returned back to the first fluid pipe 10A through the first inlet bypass pipe 54A after passing through the first housing 2200. Similarly, the second fluid flowing out from the second fluid pipe 40A through the second outlet bypass pipe 62A flows into the second housing 2300, and may be returned back to the second fluid pipe 40A through the second inlet bypass pipe 64A after passing through the second housing 2300. Accordingly, the temperature of the first fluid flowing along the first housing 2200 may be lower than the temperature of the second fluid flowing along the second housing 2300. In this case, the direction in which the first fluid flows through the first housing 2200 and the direction in which the second fluid flows through the second housing 2300 may be different from each other. For example, the direction in which the first fluid flows through the first housing 2200 and the direction in which the second fluid flows through the second housing 2300 are parallel to each other, but may be opposite to each other.

Here, the thermoelectric module 2100 may be disposed between the first housing 2200 and the second housing 2300. The thermoelectric module 2100 includes a first side, for example, a low-temperature side and a second side, for example, a high-temperature side, wherein the housing 2200 may be disposed on the low temperature side of the thermoelectric module 2100, and the second housing 2300 may be disposed on the high temperature side of the thermoelectric module 2100. Accordingly, the first fluid may flow toward the low-temperature part of the thermoelectric module 2100, and the second fluid may flow toward the high-temperature part of the thermoelectric module 2100, wherein the temperature difference between the low-temperature part and the high-temperature part of the thermoelectric module 2100 may be maintained at a predetermined level or more, and electricity may be generated using the temperature difference.

The thermoelectric module 2100 according to an embodiment of this invention includes a thermoelectric element 100 and a heat dissipation fin 200. Here, the description of the thermoelectric element 100 is the same as that described with reference to FIGS. 5 to 8, and thus the duplicate descriptions is omitted for convenience of description.

In an embodiment of this invention, it is intended to improve the power generation performance by increasing the temperature difference between the low-temperature part and the high-temperature part of the thermoelectric module.

To this end, referring again to FIGS. 14 to 15, in order for the first fluid flowing through the first fluid pipe 10A to be accommodated in the first housing 2200, a first connection inlet pipe 2510 may be disposed at the inlet of the first housing 2200, a first connection discharge pipe 2520 may be disposed at the outlet of the first housing 2200, the first connection inlet pipe 2510 may be connected to the first outlet bypass pipe 52A of the first fluid pipe 10A, and the first connection discharge pipe 2520 may be connected to the first inlet bypass pipe 54A of the first fluid pipe 10A.

Similarly, in order for the second fluid flowing through the second fluid pipe 40A to be accommodated in the second housing 2300, a second connection inlet pipe 2530 may be disposed at the inlet of the second housing 2300, a second connection discharge pipe 2540 may be disposed at the outlet of the second housing 2300, the second connection inlet pipe 2530 may be connected to the second outlet bypass pipe 62A of the second fluid pipe 40A, and a second connection discharge pipe 2540 may be connected to the second inlet bypass pipe 64A of the second fluid pipe 40A. Accordingly, after the first fluid flows into the first housing 2200, that is, toward the low-temperature part side of the thermoelectric module 2100 through the first fluid inlet pipe 2510, the first fluid may be discharged from the first housing 2200 through the first fluid discharge pipe 2520, while, after the second fluid flows into the second housing 2300, that is, toward the high-temperature part side of the thermoelectric module 2100 through the second fluid inlet pipe 2530, the second fluid may be discharged from the second housing 2300 through the second fluid discharge pipe 2540.

In this case, each of the first connection inlet pipe 2510, the first connection discharge pipe 2520, the second connection inlet pipe 2530, and the second connection discharge pipe 2540 may be formed of a tube whose length can be adjusted. For example, at least one of the first connection inlet pipe 2510, the first connection discharge pipe 2520, the second connection inlet pipe 2530, and the second connection discharge pipe 2540 may be formed of a bellows pipe. Accordingly, it is possible to install the standardized power-generating apparatus 2000 without being limited by the distance between the first fluid pipe 10A and the second fluid pipe 40A.

Meanwhile, as the temperature of the fluid passing through the first housing 2200 is lower, the temperature difference between the high-temperature part and the low-temperature part of the thermoelectric module 2100 may become greater. In addition, as the temperature of the fluid passing through the second housing 2300 is higher, the temperature difference between the high-temperature part and the low-temperature part of the thermoelectric module 2100 may become greater. That is, as the temperature of the fluid flowing into the first housing 2200 is lower and the temperature of the fluid flowing into the second housing 2300 is higher, the power generation performance of the thermoelectric module 2100 may become higher. To this end, the length of the second connection inlet pipe 2530 may be shorter than that of the first connection inlet pipe 2510. As described above, since each of the first connection inlet pipe 2510, the first connection discharge pipe 2520, the second connection inlet pipe 2530 and the second connection discharge pipe 2540 may be formed of a tube whose length can be adjusted, it is difficult to arrange a thermal insulating material on the surfaces of the first connection inlet pipe 2510, the first connection discharge pipe 2520, the second connection inlet pipe 2530, and the second connection discharge pipe 2540. Accordingly, the heat from the fluid passing through the first connection inlet pipe 2510, the first connection discharge pipe 2520, the second connection inlet pipe 2530, and the second connection discharge pipe 2540 may be discharged to the surroundings through the first connection inlet pipe 2510, the first connection discharge pipe 2520, the second connection inlet pipe 2530, and the second connection discharge pipe 2540. Accordingly, if the length of the second connection inlet pipe 2530 is shorter than the length of the first connection inlet pipe 2510, the heat emitted to the outside of the second connection inlet pipe 2530 can be minimized when the fluid passes through the second connection inlet pipe 2530 to flow into the second housing 2300, so that the temperature of the fluid flowing into the second housing 2300 may be maintained as high as possible. Additionally, if the length of the first connection inlet pipe 2510 is longer than that of the second connection inlet pipe 2530, the heat emitted to the outside of the first connection inlet pipe 2510 can be maximized when the fluid passes through the first connection inlet pipe 2510 to flow into the first housing 2200, so that the temperature of the fluid flowing into the first housing 2200 may be maintained as low as possible.

Meanwhile, according to an embodiment of this invention, the first thermal insulating member 2400 may be disposed on the side surfaces of the thermoelectric module 2100 between the first housing 2200 and the second housing 2300. As shown in FIG. 15, when there are a plurality of thermoelectric modules 2100, the first thermal insulating member 2400 may be disposed even between two thermoelectric modules 2100.

Accordingly, a predetermined temperature difference ΔT may be maintained between the low-temperature part and the high-temperature part of the thermoelectric module 2100, and thus power generation performance can be improved.

Meanwhile, as described above, as the temperature of the fluid passing through the first housing 2200 is lower, the temperature difference between the high-temperature part and the low-temperature part of the thermoelectric module 2100 may become greater, and as the temperature of the fluid passing through the second housing 2300 is higher, the temperature difference between the high-temperature part and the low-temperature part of the thermoelectric module 2100 may become greater. As the temperature difference between the high-temperature part and the low-temperature part of the thermoelectric module 2100 becomes greater, the power generation performance can become better. To this end, it is important to minimize heat loss through the second housing 2300.

For this purpose, an air layer G may be formed between the inner wall 2310 of the second housing 2300 and the second fluid in the second housing 2300. Here, the inner wall 2310 of the second housing 2300 may be the uppermost surface of the inner wall of the second housing 2300. That is, the inner wall 2310 of the second housing 2300 may be a wall opposite to the first wall surface 2320 on which the thermoelectric module 2100 is disposed. The air layer G may thermally insulate the second fluid in the second housing 2300 from the outside of the second housing 2300. Accordingly, it is possible to inhibit the problem that the heat from the second fluid flowing along the second housing 2300 is discharged to the surroundings through the second housing 2300.

At this time, in order to form the air layer G in the second housing 2300, as shown, the first housing 2200 needs to be disposed below the thermoelectric module 2100 and the second housing 2300 needs to be disposed above the thermoelectric module 2100 with the thermoelectric module 2100 interposed therebetween. Also, the volume of the second housing 2300 may be greater than that of the first housing 2200. Accordingly, even if the amount or velocity of the fluid flowing into the first housing 2200 is the same as the amount or velocity of the fluid flowing into the second housing 2300, a space for forming the air layer G may be prepared in the second housing 2300. Alternatively, the height of the second housing 2300 may be greater than that of the first housing 2200.

In order to increase the temperature difference between the high-temperature part and the low-temperature part of the thermoelectric module 2100, according to an embodiment of this invention, a second heat insulating member 2700 covering the outer surface of the second housing 2300 may be further disposed. Accordingly, it is possible to inhibit the problem that the heat from the fluid flowing along the second housing 2300 is discharged to the surroundings through the second housing 2300. In this connection, if the thermal insulating member is not disposed on the outer surface of the first housing 2200, the temperature difference between the high-temperature part and the low-temperature part of the thermoelectric module 2100 may be further increased.

Meanwhile, according to an embodiment of this invention, the first housing 2200, the thermoelectric module 2100, and the second housing 2300 may be fastened through the fastening member 2600. In this case, the fastening member 2600 may include a head part 2610 and a connection part 2620 extending from the head part 2610. The head part 2610 may be disposed on the outer surface of the first housing 2200, and the connection part 2620 may pass through at least a portion of the first housing 2200, the thermoelectric module 2100, and the second housing 2300, and connect them to each other. Accordingly, the heat from the fluid flowing along the first housing 2200 may be discharged to the surroundings through the head part 2610 of the fastening member 2600.

Meanwhile, an end of the connection part 2620 may be disposed inside the second housing 2300. In this case, the height (a) of the connection part 2620 disposed in the second housing 2300 may be 0.5 times or less the total height (A) in the second housing 2300. For example, an end of the connection part 2620 may be disposed in the second fluid of the second housing 2300, and may be spaced apart from the air layer G. According to this, it is possible to inhibit the heat from the fluid flowing along the second housing 2300 from being emitted to the outside through the connection part 2610 of the fastening member 2600, and the temperature difference between the high-temperature part and the low-temperature part of the thermoelectric module 2100 can be increased.

Although not shown, at least a portion of the surface of the fastening member 2600 may be waterproofed, and a penetration region between the connection part 2620 and a wall surface of the first housing 2200, and a penetration region between the connection part 2620 and a wall surface of the second housing 2300 may be sealed. Accordingly, corrosion of the fastening member 2600 can be inhibited, and the problem of fluid leakage along the fastening member 2600 can be inhibited.

Meanwhile, according to an embodiment of this invention, at least a portion of the first housing 2200 and the second housing 2300 may be made of metal. For example, among wall surfaces constituting the first housing 2200, at least a wall surface on which the thermoelectric module 2100 is disposed may include a flat wall surface made of metal. Similarly, among the wall surfaces constituting the second housing 2300, at least a wall surface on which the thermoelectric module 2100 is disposed may include a flat wall surface made of metal. Accordingly, it is easy to arrange the first housing 2200 and the second housing 2300 on both sides of the thermoelectric module 2100, and the temperature of the fluid passing through the first housing 2100 and the temperature of the fluid passing through the second housing 2300 may be efficiently transferred to the low-temperature part and the high-temperature part of the thermoelectric module 2100.

Here, the metal may be, for example, aluminum, copper, and alloys thereof, but is not limited thereto. In this case, the surface of the metal may be oxidized. Accordingly, corrosion of the first housing 2200 and the second housing 2300 may be inhibited.

Alternatively, as shown in FIGS. 15 and 16A to 16C, the first side of the thermoelectric module 2100, that is, the low-temperature part side, is embedded in the first housing 2200 so as to directly contact the first fluid of the first housing 2200, and the second side of the thermoelectric module 2100, that is, the high-temperature part side, may be embedded in the second housing 2300 so as to directly contact the second fluid of the second housing 2300.

More specifically, referring to FIG. 16A, the first surface of each thermoelectric element 100, for example, the lower substrate 110 may be in contact with one wall surface 2220 of the first housing 2200, and a second surface opposite to the first surface, for example, the upper substrate 160 may be in contact with one wall surface 2320 of the second housing 2300. In this connection, the heat dissipation fin 200 including a metal may be disposed on each of one of both surfaces of the wall surface 2220 facing the inside of the first housing 2200 and one of both surfaces of the wall surface 2320 facing the inside of the second housing 2300, and the heat dissipation fins 200 may be disposed on each of the inner wall of the first housing 2200 and the inner wall of the second housing 2300.

Alternatively, referring to FIG. 16B, the first surface of each thermoelectric element 100, for example, the lower substrate 110 may pass through one wall surface 2220 of the first housing 2200 and be disposed within the first housing 2200, and the second surface opposite to the first surface, for example, the upper substrate 160 may pass through one wall surface 2320 of the second housing 2300 and be disposed in the second housing 2300. Accordingly, the heat dissipation fin 200 disposed on the lower substrate 110 of the thermoelectric element 100 and the heat dissipation fin 200 disposed on the upper substrate 160 of the thermoelectric element 100 may be disposed inside each of the first housing 2200 and the second housing 2300.

Alternatively, referring to FIG. 16C, the first surface of each thermoelectric element 100, for example, the lower substrate 110 is embedded in one wall surface 2220 of the first housing 2200, and the second surface opposite to the first surface, for example, the upper substrate 160 may be embedded in one wall surface 2320 of the second housing 2300. Accordingly, the heat dissipation fin 200 disposed on the lower substrate 110 of the thermoelectric element 100 and the heat dissipation fin 200 disposed on the upper substrate 160 of the thermoelectric element 100 may be disposed inside each of the first housing 2200 and the second housing 2300.

Accordingly, the temperature of the first fluid flowing through the first housing 2200 is transferred to the first surface of each thermoelectric element 100, for example, the lower substrate 110, so that the lower substrate 110 may act as the low-temperature part, and the temperature of the second fluid flowing through the second housing 2300 is transferred to the second surface of each thermoelectric element 100, for example, the upper substrate 160, so that the upper substrate 160 may act as the high-temperature part, wherein electricity may be generated by using the temperature difference $\Delta T$ between the high-temperature part and the low-temperature part.

Here, the height h of the heat dissipation fin 200 may be 0.1 to 0.9 times each of the maximum height H of the fluid flowing through the first housing 2200 and the maximum height H of the fluid flowing through the second housing 2300. According to this, while efficiently transferring the temperature of the fluid to the thermoelectric element, the flow of the fluid may not be disturbed.

Meanwhile, according to yet another embodiment of this invention, a cooling unit may be further included for further increasing the temperature difference $\Delta T$ between the low-temperature part and the high-temperature part of the thermoelectric element.

FIG. 17 represents a power-generating apparatus according to yet another embodiment of this invention. Duplicate descriptions of the same contents as those described with reference to FIGS. 3 to 16C will be omitted.

Referring to FIG. 17, the power-generating apparatus 2000 further includes a cooling unit 2800 for cooling the outer surface of the first housing 2200, which is driven using the flow rate of the fluid flowing along the first housing 2200.

According to an embodiment of this invention, the cooling unit 2800 may include a first fan 2810, a first rotation shaft 2820, gears 2830, a second rotation shaft 2840, and a second fan 2850.

The first fan 2810 is disposed in the first housing 2200, and may be rotated by the fluid flowing along the first housing 2200. In addition, the first rotation shaft 2820 may be connected to the first fan 2810 and extend out of the first housing 2200, and may rotate together with the first fan 2810. In this case, the space between the first rotation shaft 2820 and the first pipe 2200 may be sealed.

Meanwhile, the gears 2830 may be connected to the first rotation shaft 2820, and the second rotation shaft 2840 may be connected to the gears 2830. Accordingly, the second rotation shaft 2840 may rotate in a direction different from that of the first rotation shaft 2820. For example, the second rotation shaft 2840 may rotate in a direction different from that of the first rotation shaft 2820 by about 90°. In addition, a second fan 2850 may be connected to the second rotation shaft 2840, and the second fan 2850 may rotate together with the second rotation shaft 2840. In this case, the second fan 2850 may be disposed around the outer surface of the first housing 2200. Due to the rotation of the second fan 2850, the air around the second fan 2850 may be cooled, and thus, the outer surface of the first housing 2200 may also be cooled, and the temperature of the fluid flowing through the first housing 2200 may be lowered.

In this case, the wind speed of the second fan 2850 may be 3.7 m/s or more, preferably 4 m/s or more, and more preferably 5 m/s or more.

According to this, it is possible to cool the first housing 2200 using the energy of the flow rate without a separate external power source, and accordingly, the temperature difference $\Delta T$ between the high-temperature part and the low-temperature part can be maximized.

Electricity obtained from the power-generating apparatus according to an embodiment of this invention may be stored in the battery unit, and the electricity stored in the battery unit may be supplied to various electronic devices, such as sensing devices, around the power-generating apparatus.

Accordingly, the remaining energy may be utilized, and electrical wiring work may be easily performed.

Although described above with reference to the preferred embodiment of this invention, still other embodiments are also possible by combining at least some ones of some features of one embodiment, some features of another embodiment and some features of yet another embodiment.

While the present invention has been described with reference to the exemplary embodiments thereof, it will be understood by those skilled in the art that various changes in form and details may be made therein without departing from the spirit and scope of the invention as defined by the appended claims.

The invention claimed is:

1. A power-generating apparatus comprising:
    a housing configured for a fluid to flow through it, the housing including a flat surface of which at least a portion of a wall surface is made of metal;
    thermoelectric modules disposed on the flat surface of the housing; and
    thermal insulating members disposed on side surfaces of the thermoelectric modules on the flat surface of the housing,
    wherein the fluid is configured to flow into the housing through an inlet pipe, and the fluid is configured to be discharged to the outside of the housing through an outlet pipe,
    wherein the housing includes a plurality of branch pipes through which the fluid having flowed along the inlet pipe branches and passes, and the plurality of branch pipes are combined in the outlet pipe,
    wherein an angle formed by a first inner surface of a first region constituting a first branch pipe of the plurality of branch pipes and a second inner surface of a second region constituting a second branch pipe of the plurality of branch pipes on one side of the first region is 80° to 100°,
    wherein an angle formed by the first inner surface and a third inner surface of a third region constituting a third branch pipe of the plurality of branch pipes on an other side of the first region is 80° to 100°,
    wherein the thermoelectric modules include a first thermoelectric module disposed on a first outer surface of the first region, a second thermoelectric module disposed on a second outer surface of the second region and a third thermoelectric module disposed on a third outer surface of the third region,
    wherein the second inner surface and the third inner surface face toward each other, and
    wherein the first outer surface is an opposite surface of the first inner surface, the second outer surface is an opposite surface of the second inner surface, and the third outer surface is an opposite surface of the third inner surface.

2. The power-generating apparatus of claim 1, wherein the thermoelectric modules and the thermal insulating members are disposed to directly contact the flat surface of the housing, respectively.

3. The power-generating apparatus of claim 1, wherein each of the thermoelectric modules includes a thermoelectric element and a heat sink disposed on the thermoelectric element, and a first surface of the thermoelectric element is in contact with the flat surface, and the heat sink is disposed on a second surface of the thermoelectric element opposite to the first surface.

4. The power-generating apparatus of claim 3, comprising a cooling unit for cooling the heat sink, which is driven using a flow rate of the fluid flowing along the inlet pipe.

* * * * *